(12) United States Patent
Chung

(10) Patent No.: US 6,559,045 B2
(45) Date of Patent: May 6, 2003

(54) FABRICATION OF INTEGRATED CIRCUITS WITH BORDERLESS VIAS

(75) Inventor: Henry Chung, Cupertino, CA (US)

(73) Assignee: Alliedsignal Inc., Morristown, NJ (US)

( * ) Notice: Subject to any disclaimer, the term of this patent is extended or adjusted under 35 U.S.C. 154(b) by 0 days.

(21) Appl. No.: 10/170,612

(22) Filed: Jun. 12, 2002

(65) Prior Publication Data

US 2002/0158283 A1 Oct. 31, 2002

Related U.S. Application Data

(62) Division of application No. 09/328,649, filed on Jun. 9, 1999, now Pat. No. 6,452,275.

(51) Int. Cl.[7] .................. H01L 21/4763; H01L 23/48; H01L 23/52; H01L 29/40
(52) U.S. Cl. ............... 438/622; 257/758; 257/759; 257/760; 438/623; 438/624; 438/631; 438/633
(58) Field of Search .................. 438/622–624, 438/631, 633, 518, 597; 257/758–760

(56) References Cited

U.S. PATENT DOCUMENTS

| | | | |
|---|---|---|---|
| 4,605,470 A | 8/1986 | Gwozdz et al. ............ 156/643 |
| 5,420,075 A | 5/1995 | Homma et al. ............ 437/195 |
| 5,619,072 A * | 4/1997 | Mehta ....................... 257/760 |
| 5,661,344 A * | 8/1997 | Havemann et al. ........ 257/637 |
| 5,798,298 A * | 8/1998 | Yang et al. ................ 438/622 |
| 5,801,094 A | 9/1998 | Yew et al. ................. 438/624 |
| 5,858,869 A * | 1/1999 | Chen et al. ................ 438/597 |
| 5,889,330 A * | 3/1999 | Nishimura et al. ......... 257/40 |
| 5,946,601 A * | 8/1999 | Wong et al. ........... 148/DIG. 1 |
| 6,046,106 A * | 4/2000 | Tran et al. ................. 438/622 |
| 6,278,174 B1 * | 8/2001 | Havemann et al. ........ 257/524 |
| 6,300,672 B1 * | 10/2001 | Lee ............................ 257/632 |
| 6,362,527 B1 * | 3/2002 | Mehta ....................... 257/758 |
| 6,452,275 B1 * | 9/2002 | Chung ....................... 257/759 |

OTHER PUBLICATIONS

"High Stud–to–Line Contact Area in Damascene Metal Processing"; IBM Technical Disclosure Bulletin, vol. 33, No. IA, Jun. 1990.

\* cited by examiner

Primary Examiner—Ngân V. Ngô
Assistant Examiner—Thao X. Le
(74) Attorney, Agent, or Firm—Roberts & Mercanti, LLP

(57) ABSTRACT

The invention relates to the formation of structures in microelectronic devices such as integrated circuit devices by means of borderless via architectures in intermetal dielectrics. An integrated circuit structure has a substrate, a layer of a second dielectric material positioned on the substrate and spaced apart metal contacts are on the layer of the second dielectric material. The metal contacts have side walls, and a lining of a first dielectric on the side walls; a space between the linings on adjacent metal contact side walls filled with the second dielectric material, a top surface of each of the metal contacts, the linings and the spaces are at a common level. An additional layer of the second dielectric material is on some of the metal contacts, linings and filled spaces. At least one via extends through the additional layer of the second dielectric material and extends to the top surface of at least one metal contact and optionally at least one of the linings.

24 Claims, 38 Drawing Sheets

Step 11: CMP of W, barrier metal and sacrificial metal

Conventional architecture I

Conventional architecture II

Conventional architecture III

New architecture I
borderless via

New architecture II
borderless via

New architecture III
borderless via

New architecture IV
borderless via

New architecture V
borderless via

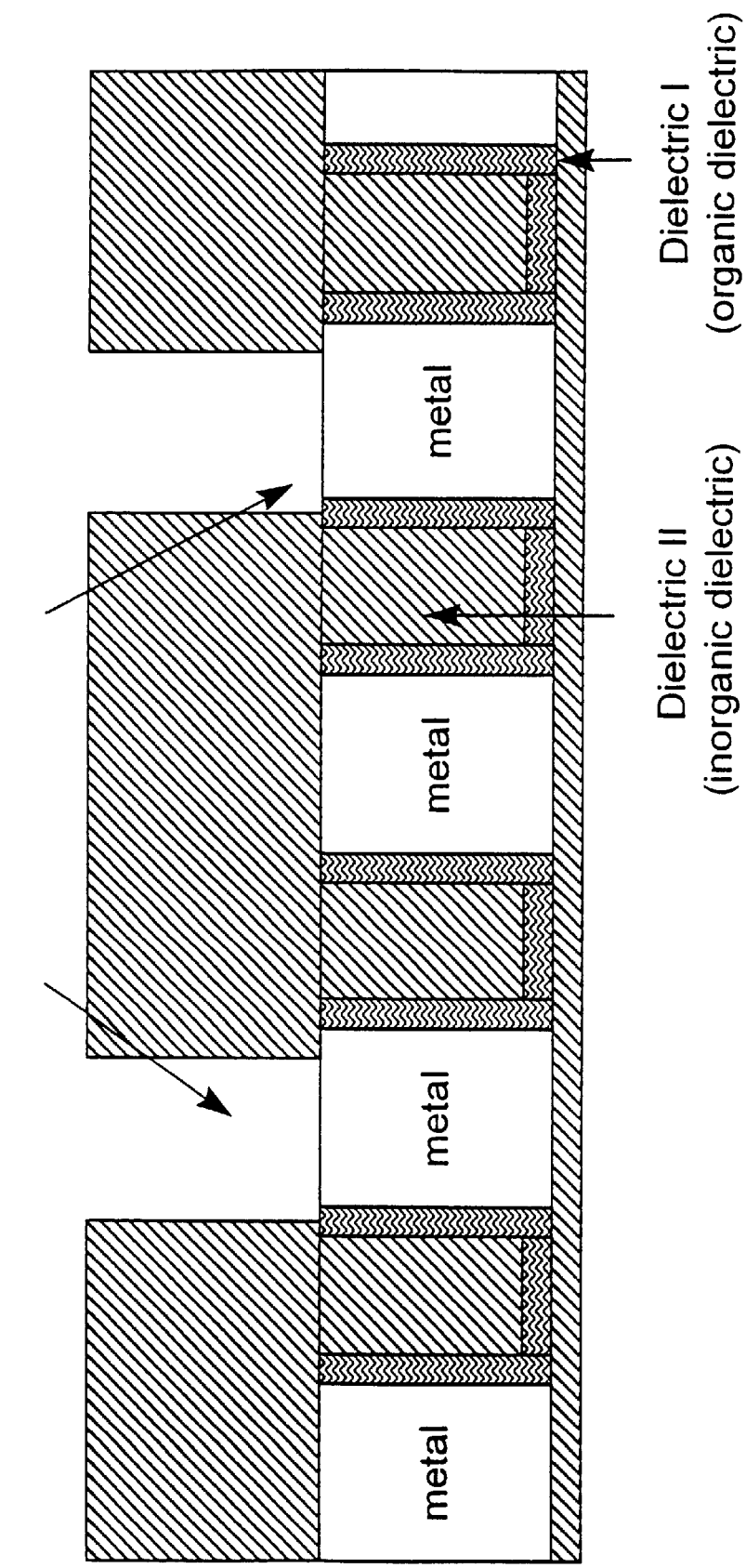

Step 0: After metal patterning

Step 1: Conformal deposition of inorganic dielectric

Step 2: Anisotropic inorganic dielectric etchback

Step 3: Organic dielectric deposition
Step 4: Sacrificial metal deposition
Step 5: Resist spin and bake Step 6: Via mask and resist development Step 7: Anisotropic sacrificial metal etch Step 8: Anisotropic organic dielectric etch Step 9: Barrier metal and W depositions Step 10: CMP of W, barrier metal and sacrificial metal Step 2: CMP of inorganic dielectric Step 0: After metal patterning Step 1: Conformal deposition of inorganic dielectric

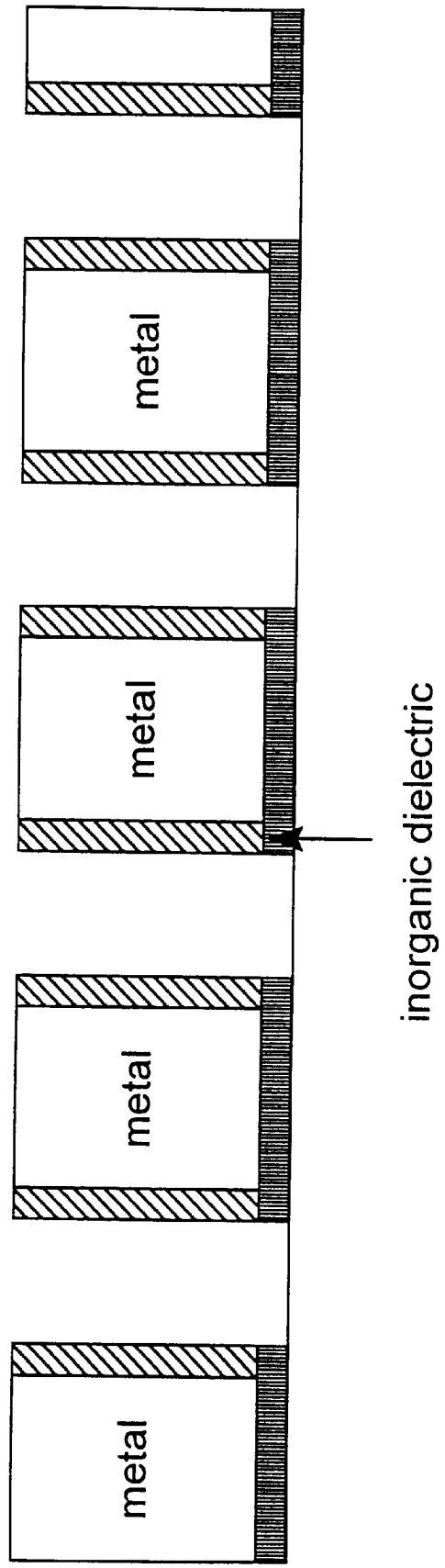

Step 3: Organic dielectric deposition
Step 4: Inorganic dielectric deposition
Step 5: Resist spin and bake Step 6: Via mask and resist development Step 7: Anisotropic inorganic dielectric etch Step 8: Anisotropic organic dielectric etch Step 2: CMP of inorganic dielectric Step 0: After metal patterning Step 1: Conformal deposition of organic dielectric Step 2: Anisotropic organic dielectric etchback Step 3: Inorganic dielectric deposition
Step 4: Sacrificial metal deposition
Step 5: Resist spin and bake Step 6: Via mask and resist development Step 7: Anisotropic sacrificial metal etch Step 8: Resist removal Step 9: Anisotropic inorganic dielectric etch Step 10: Barrier metal and W depositions Step 11: CMP of W, barrier metal and sacrificial metal Step 2: CMP of organic dielectric

FABRICATION OF INTEGRATED CIRCUITS WITH BORDERLESS VIAS

CROSS REFERENCE TO RELATED APPLICATION

This application is a division of U.S. patent application Ser. No. 09/328,649, filed Jun. 9, 1999 now U.S. Pat. No. 6,452,275 which is incorporated herein by reference.

BACKGROUND OF THE INVENTION

1. Field of the Invention

The present invention relates to the formation of structures in microelectronic devices such as integrated circuit devices. More particularly, the invention relates to the formation of borderless vias in intermetal dielectrics.

2. Description of the Related Art

As feature sizes in the production of integrated circuits approach 0.25 μm and below, problems of packing density become increasingly difficult to overcome. The formation of borderless vias is one method to reduce metal pitch in and packing density of integrated circuits. However, it is exceedingly difficult to form borderless vias in conventional subtractive interconnect patterning. The major problem is that deep and narrow trenches are produced at the side of metal lines in via etching whenever vias are misaligned to the underlying metal lines. The trench depth is extremely difficult to control since it is common practice to excess plasma etch in via etch to ensure that via holes are completely open. Organic byproducts are produced in dielectric plasma etching when opening via holes. Those byproducts accumulated at the bottom of trenches cannot be effectively removed by oxygen-based plasma or ashing which are commonly used techniques to strip photoresist used in integrated circuit fabrication. Liquid organic chemicals, which are also commonly used to remove organic byproducts, often cause corrosion of metals from which interconnects are made. As a result, via resistance can be very high and, thus, the performance and reliability of integrated circuits degrade. In extreme cases, integrated circuits fail to function when via holes are totally blocked and vias become electrically open.

The cause of the above mentioned issues of conventional architectures is the lack of a etchstop or plasma etch selectivity when opening vias. These occur in two different ways. First, the same kind of inorganic dielectric is typically used for the via-level and metal-level inter-level dielectrics (IMD☐). Even when two different kinds of inorganic dielectrics are used, as far as plasma etching for via holes is concerned, the difference between these two kinds of inorganic dielectrics is insignificant. As a result, via etch continues even when via holes are already fully opened as long as there is misalignment between via and the underlying interconnects or metal lines. The use of two different kinds of dielectrics, one inorganic and the other organic, have been used for the metal-level and the via-level IMD☐, respectively, in some prior architectures. This architecture does not have the aforesaid disadvantage architectures since there is very high plasma etch selectivity between inorganic and organic dielectrics. However, its weakness is associated with the photoresist, which is commonly used for patterning, a key technique in integrated circuit fabrication. In conventional integration methods, both the photoresist and the organic IMD☐ are exposed at the completion of via etch. The organic via-level dielectric is attacked, resulting in deep trenches along the side of metal lines when removing the photoresist which is also organic.

According to the invention one ensures that the part of the via-level IMD, which is exposed to via etch plasma due to misalignment between via and metal lines, does not etch or only insignificantly etches in via openings and during resist removal following via etch. The invention provides borderless vias in integrated circuits. Two key elements are the use of dielectrics of significantly dissimilar plasma etch characteristics and that the dielectric immediately over metal lines is different from the dielectric at the sidewall of the metal lines. These objectives are achieved by dividing the metal-level IMD into two parts. One dielectric on the sidewall of the metal lines and the rest of the metal-level IMD between the dielectric on the side walls. The two dielectrics are significantly different from each other in their plasma etch characteristics. Another embodiment adds a hardmask layer between a photoresist layer and the organic dielectric for the via-level IMD so that either resist or the organic dielectric can be selectively removed. A hardmask is also necessary when the via-level IMD is inorganic and the etchstop, at the sidewall of metal lines, in via etch is organic. The hardmask can be either permanent or sacrificial. Performance enhancement of integrated circuits is achieved with the implementation of new architectures according to this invention in conjunction with the use of dielectrics of low dielectric constant.

SUMMARY OF THE INVENTION

The invention provides an integrated circuit structure which comprises (a) a substrate;
(b) a layer of a second dielectric material positioned on the substrate;
(c) a plurality of spaced apart metal contacts on the layer of the second dielectric material, which metal contacts have side walls, and a lining of a first dielectric on the side walls; a space between the linings on adjacent metal contact side walls being filled with the second dielectric material; a top surface of each of the metal contacts, the linings and the spaces being at a common level;
(d) an additional layer of the second dielectric material on at least some of the metal contacts, linings and filled spaces; at least one via extending through the additional layer of the second dielectric material and extending to the top surface of at least one metal contact and optionally at least one of the linings.

The invention also provides an integrated circuit structure which comprises (a) a substrate;
(b) a layer of a third dielectric material positioned on the substrate;
(c) a plurality of spaced apart metal contacts on the layer of the third dielectric material, which metal contacts have side walls, and a lining of a first dielectric on the side walls; a space between the linings on adjacent metal contact side walls being filled with a second dielectric material; a top surface of each of the metal contacts, the linings and the spaces being at a common level;
(d) an additional layer of the second dielectric material on at least some of the metal contacts, linings and filled spaces; an additional a layer of the third dielectric material positioned on the additional layer of the second dielectric material; at least one via extending through the additional layer of the third dielectric material and the additional layer of the second dielectric material and extending to the top surface of at least one metal contact and optionally at least one of the linings.

The invention further provides a process for producing an integrated circuit structure which comprises (a) providing a substrate;
(b) depositing a layer of a second dielectric material on the substrate;
(c) forming a pattern of metal contacts on the layer of the second dielectric material;
(d) conformally depositing a lining of a first dielectric material on side walls of the metal contacts, on a top surface of the metal contacts, and on a floor of a space between the metal contacts on the layer of the second dielectric material;
(e) removing the first dielectric material from the top surface of the metal contacts while retaining the first dielectric material lining on the side walls of the metal contacts;
(f) depositing an additional layer of the second dielectric material on the top surface of the metal contacts and in the space between adjacent linings of the metal contacts;
(g) depositing a layer of a sacrificial metal on the additional layer of the second dielectric material;
(h) depositing a layer of a photoresist on the layer of the sacrificial metal layer;
(i) imagewise removing a portion of the photoresist over at least one metal contact and optionally over at least a portion of the lining of first dielectric material on a side wall of a metal contact;
(j) removing the portion of the layer of the sacrificial metal under the removed portion of the photoresist;
(k) removing the balance of the photoresist layer, and removing the portion of the additional layer of the second dielectric material under the removed portion of the sacrificial metal layer until at least one metal contact and optionally a lining on a side wall of a metal contact is reached thus forming at least one via through the second dielectric material extending to at least one metal contact and optionally a lining of a side wall of a metal contact. Preferably the above process employs the steps of
(l) depositing a layer of a barrier metal on the sacrificial metal layer, and on inside walls and a floor of the at least one via;
(m) filling the at least one via with a fill metal and depositing a layer of a fill metal on the layer of the barrier metal;
(n) removing the fill metal layer, the barrier metal layer and the sacrificial metal layer.

The invention still further provides a process for producing an integrated circuit structure which comprises
(a) providing a substrate;
(b) depositing a layer of a third dielectric material on the substrate;
(c) forming a pattern of metal contacts on the layer of the third dielectric material;
(d) conformally depositing a lining of a first dielectric material on side walls of the metal contacts, on a top surface of the metal contacts, and on a floor of a space between the metal contacts on the layer of the third dielectric material;
(e) removing the first dielectric material from the top surface of the metal contacts while retaining the first dielectric material lining on the side walls of the metal contacts;
(f) depositing a layer of a second dielectric material on the top surface of the metal contacts and in the space between adjacent linings of the metal contacts;
(g) depositing an additional layer of the third dielectric material on the layer of the second dielectric material;
(h) depositing a layer of a photoresist on the additional layer of the third dielectric material;
(i) imagewise removing a portion of the photoresist over at least one metal contact and optionally over at least a portion of the lining of first dielectric material on a side wall of a metal contact;
(j) removing the portion of the additional layer of the third dielectric material under the removed portion of the photoresist,
(k) removing the balance of the photoresist layer, and removing the portion of the second dielectric material under the removed portion of the additional layer of the third dielectric material until at least one metal contact and optionally a lining on a side wall of a metal contact is reached thus forming at least one via through the second dielectric material extending to at least one metal contact and optionally a lining of a side wall of a metal contact. Preferably the foregoing process employs the steps of:
(l) depositing a layer of a barrier metal on the additional layer of the third dielectric, and on the inside walls and a floor of the at least one via;
(m) filling the at least one via with a fill metal and depositing a layer of a fill metal on the layer of the barrier metal;
(n) removing the fill metal layer, the barrier metal layer and the sacrificial metal layer.

BRIEF DESCRIPTION OF THE DRAWINGS

FIG. 2F shows a sixth embodiment of a new integrated circuit architecture VI according to the invention.

Figure 3A:
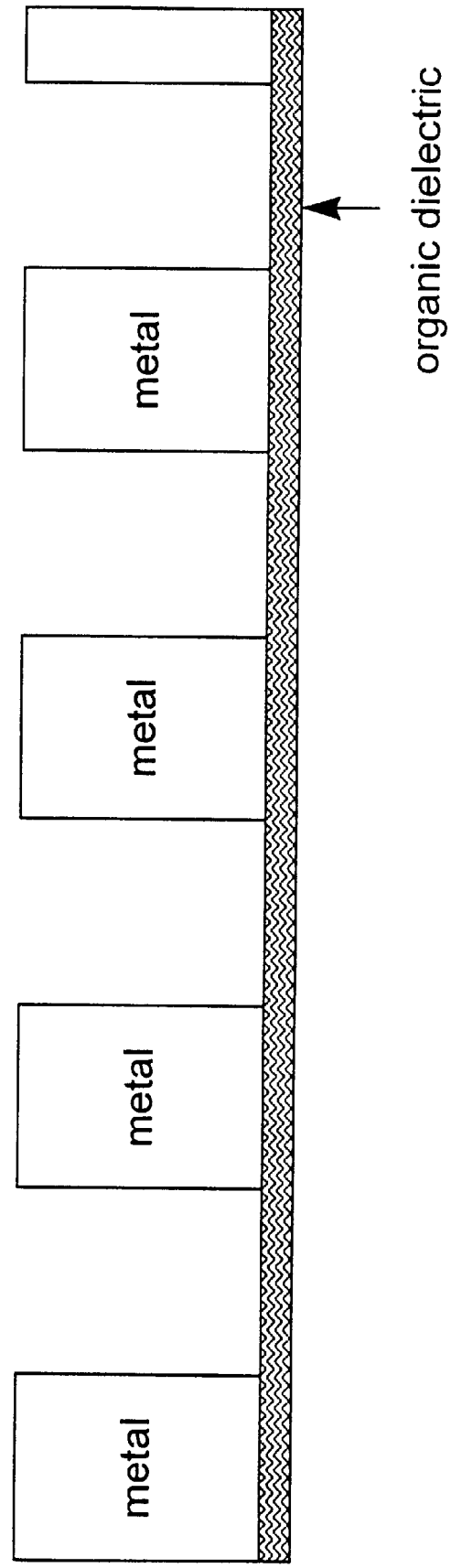
FIG. 3A shows the result of the first step of the formation process for a first embodiment of the invention, architecture I, resulting after metal patterning.
Figure 3B:
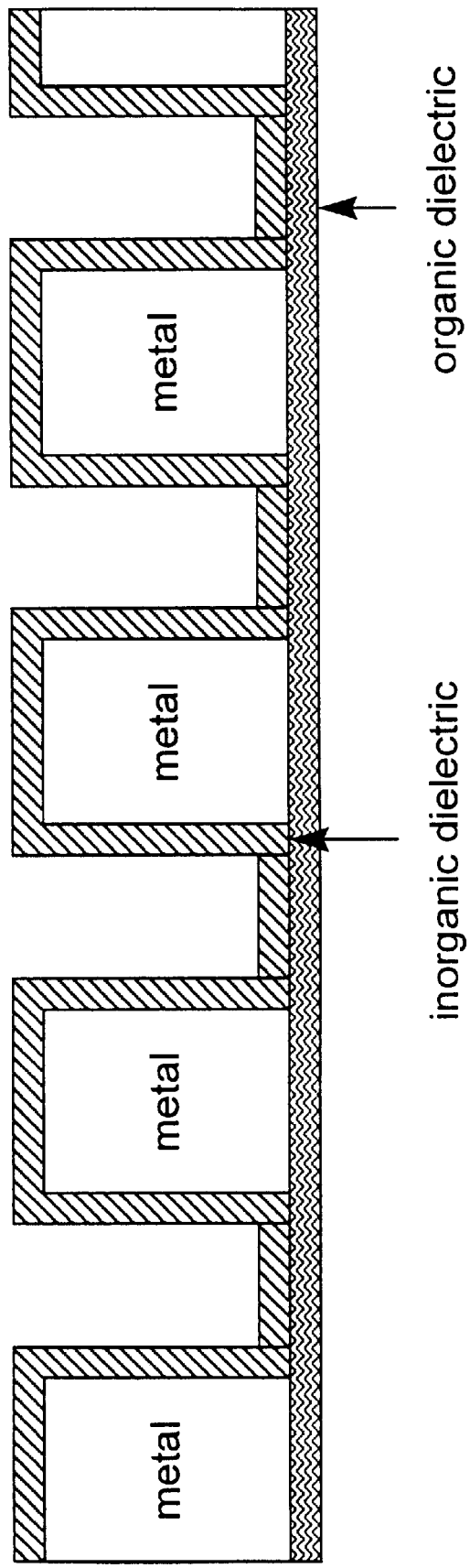
FIG. 3B shows the formation process resulting after conformal deposition of inorganic dielectric.

Prior steps are analogous to FIGS. 3A–3B and subsequent steps are analogous to FIGS. 3D–3I.

Figure 5A:
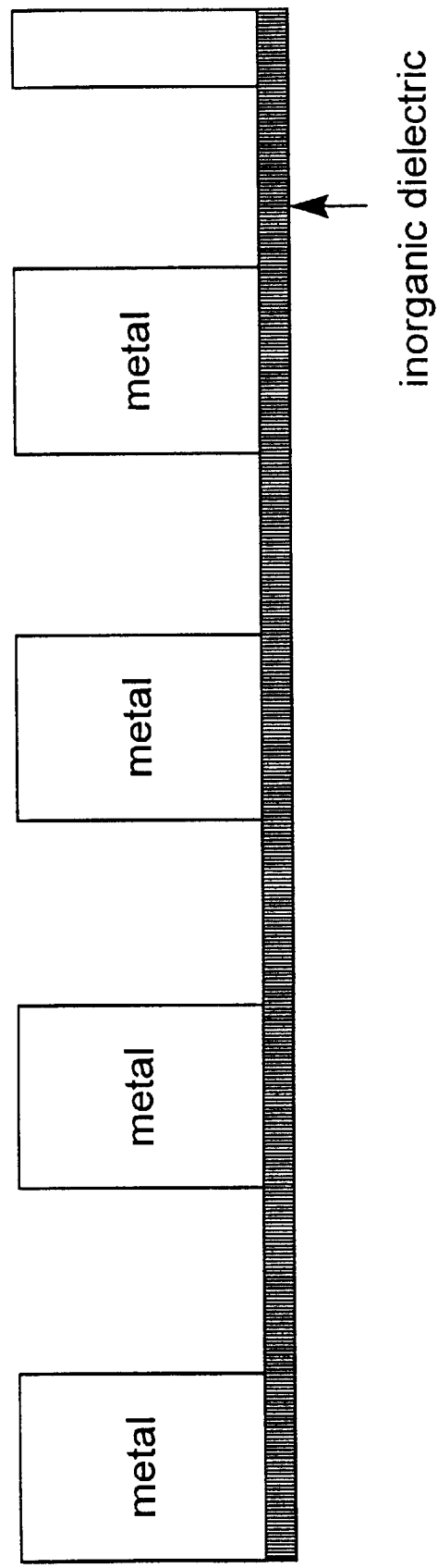

FIG. 5A shows the result of the first step of the formation process for a third embodiment of the invention, architecture III resulting after metal patterning.

Figure 5B:
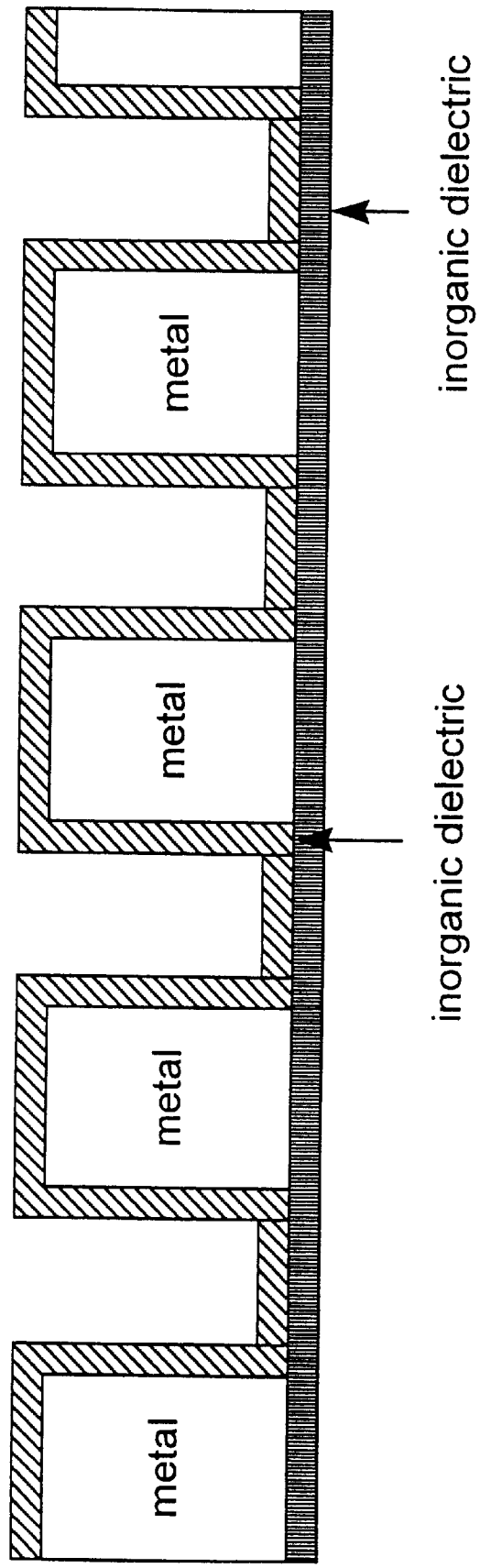

FIG. 5B shows the formation process resulting after conformal deposition of an inorganic dielectric.

FIG. 5C shows the formation process resulting after anisotropic inorganic dielectric etchback.

Figure 5D:
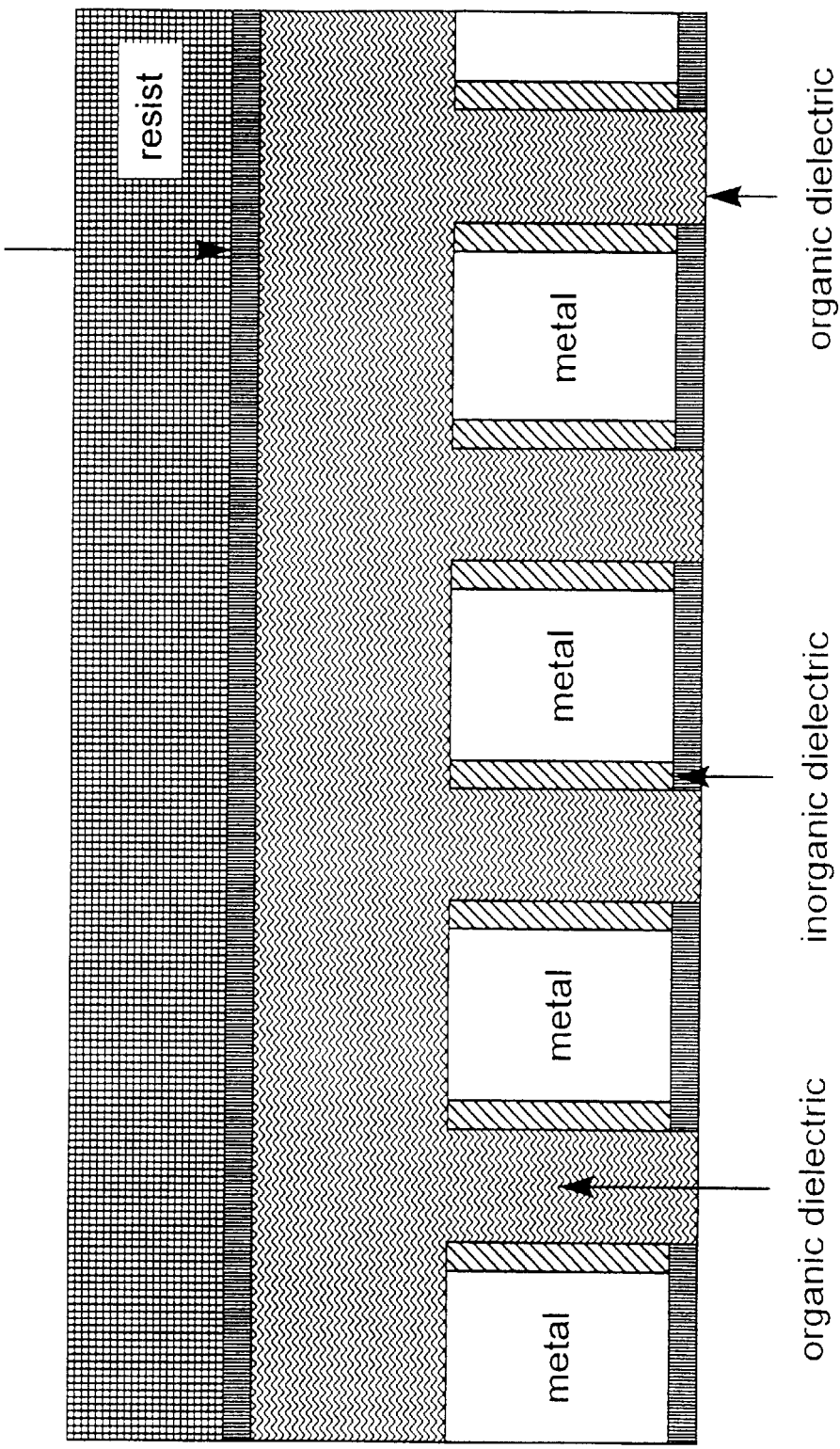

FIG. 5D shows the formation process resulting after organic dielectric deposition, inorganic dielectric deposition, resist spin and bake.

Figure 5E:
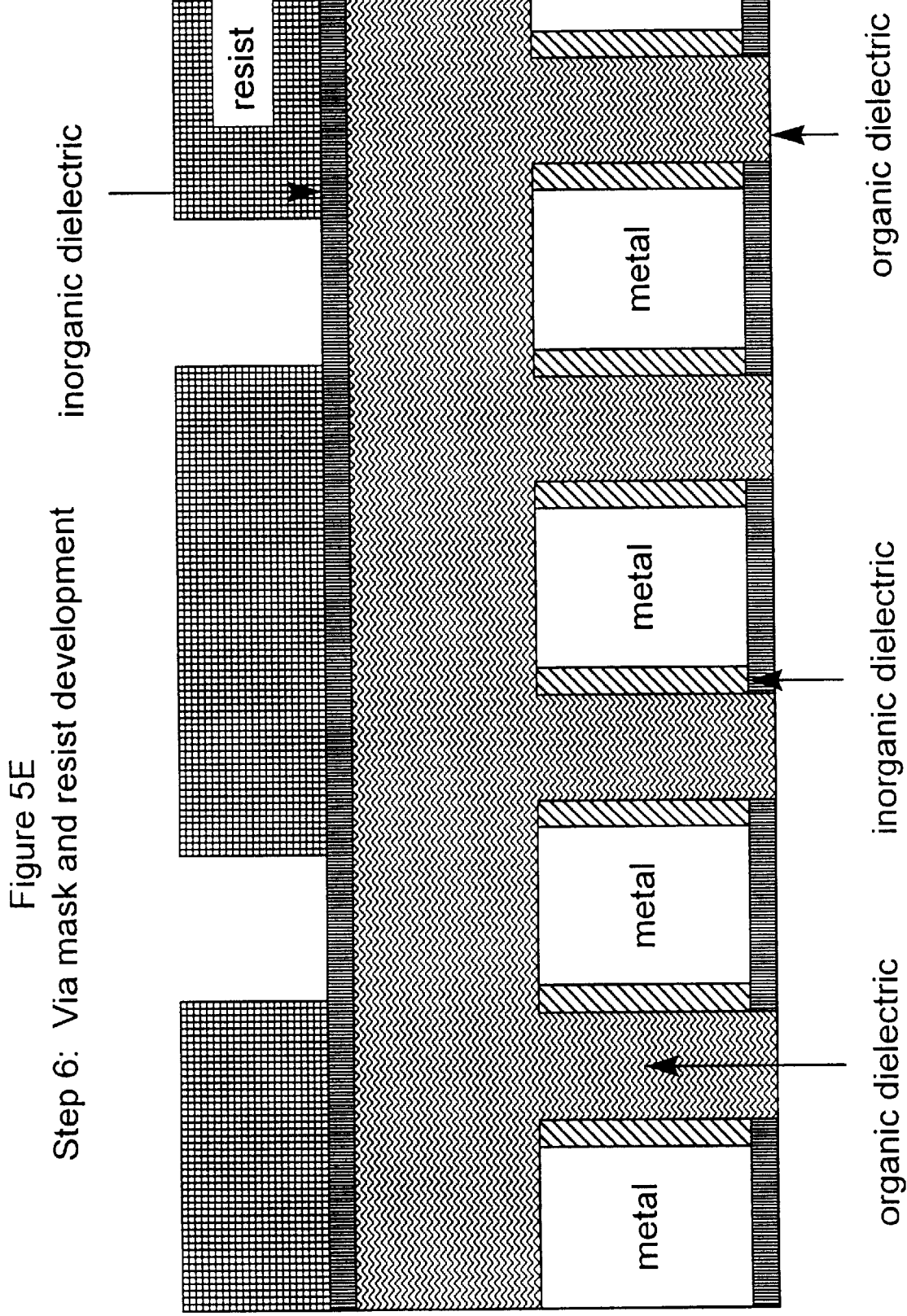

FIG. 5E shows the formation process resulting after via mask and resist development.

Figure 5F:
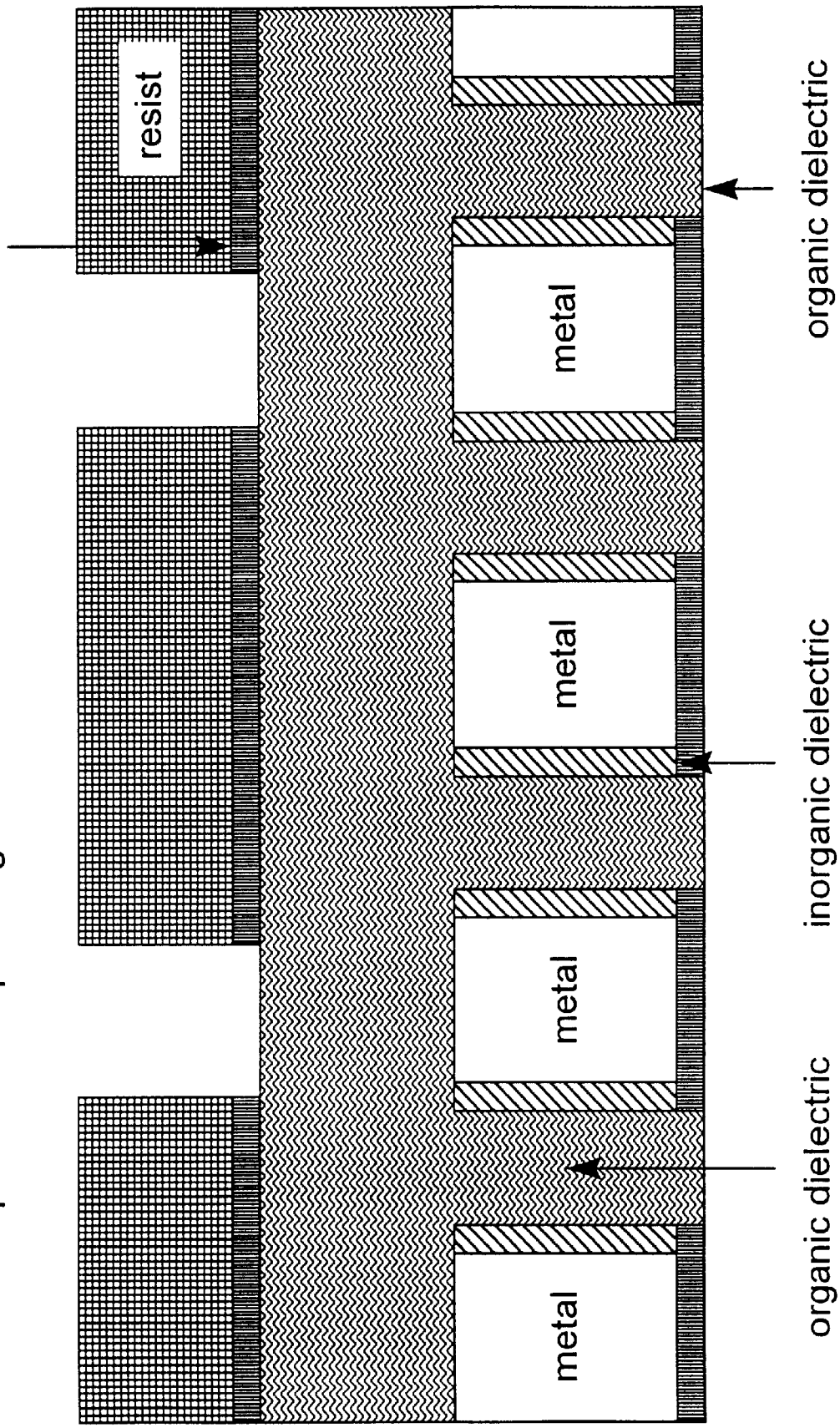

FIG. 5F shows the formation process resulting after anisotropic inorganic dielectric etch.

Figure 5G:
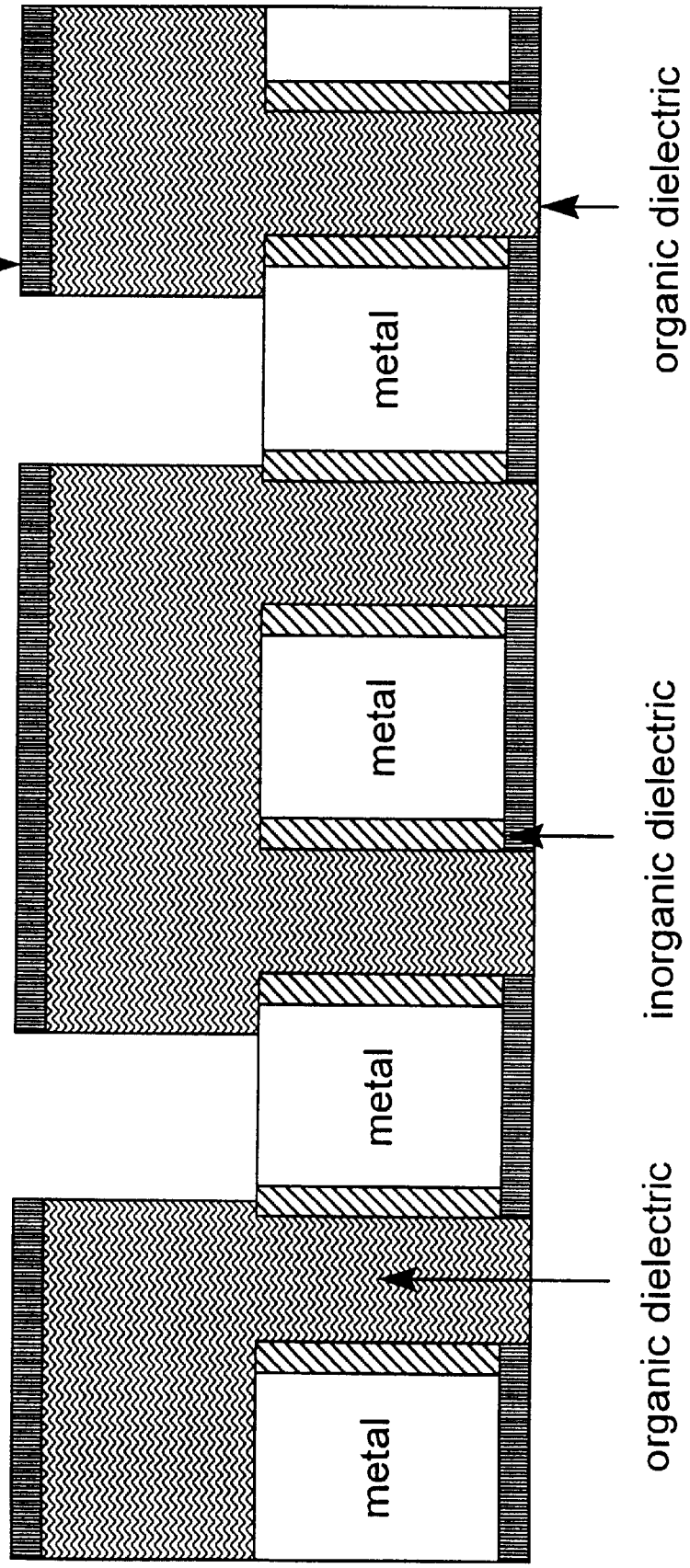

FIG. 5G shows the formation process resulting after anisotropic organic dielectric etch.

Figure 6:
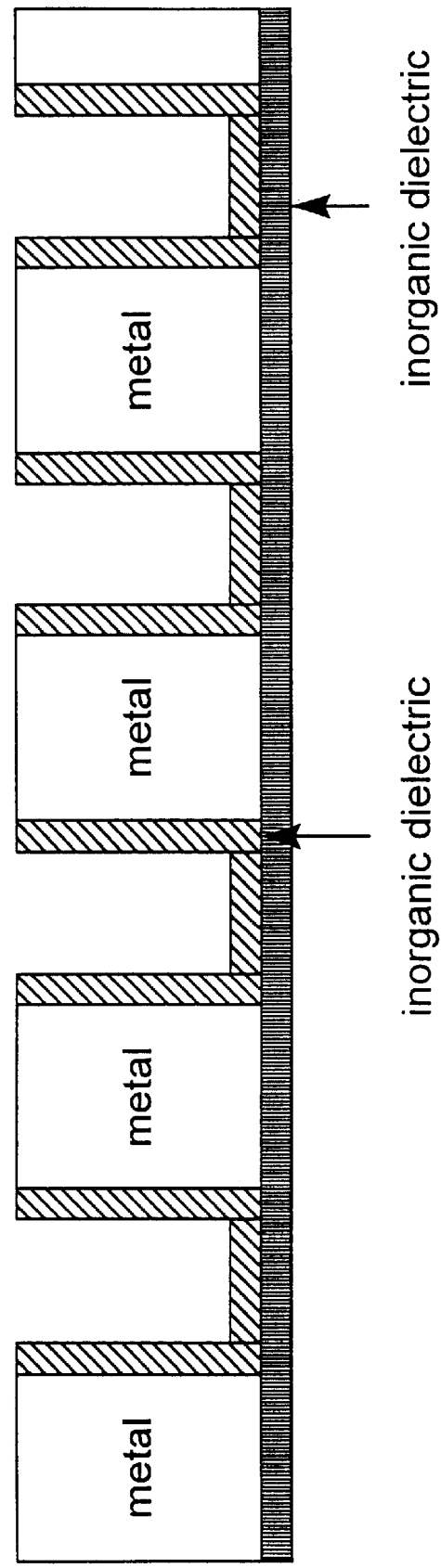

FIG. 6 shows a formation process step for a fourth embodiment of the invention, architecture IV resulting after chemical mechanical polishing of the inorganic dielectric. Prior steps are analogous to FIGS. 5A–5B and subsequent steps are analogous to FIGS. 5D–5G.

Figure 7A:
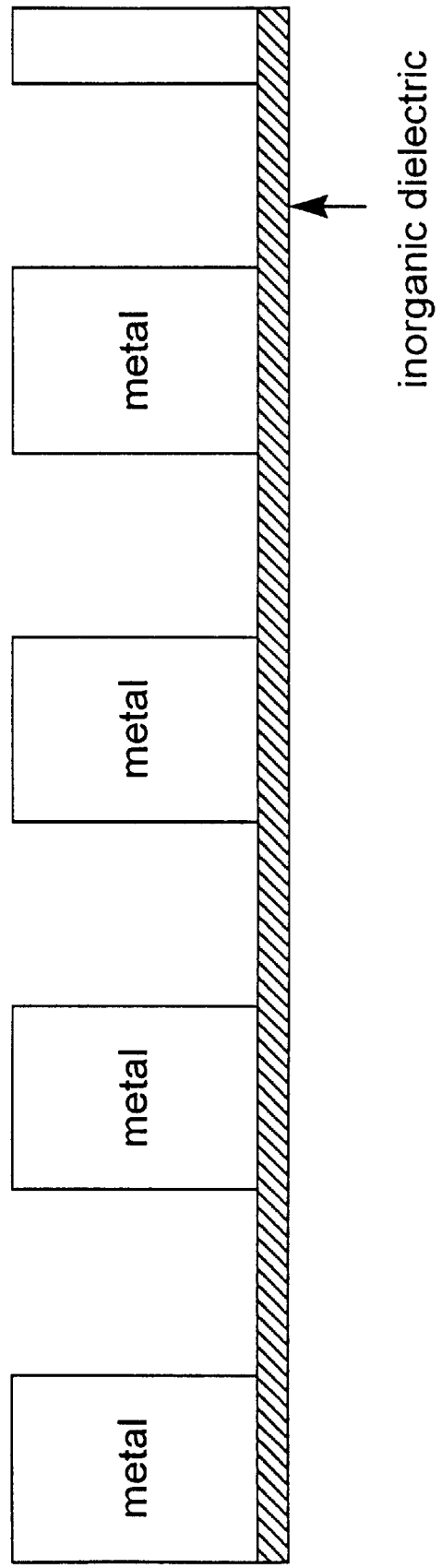

FIG. 7A shows the result of the first step of the formation process for a fifth embodiment of the invention, architecture V, resulting after metal patterning.

Figure 7B:
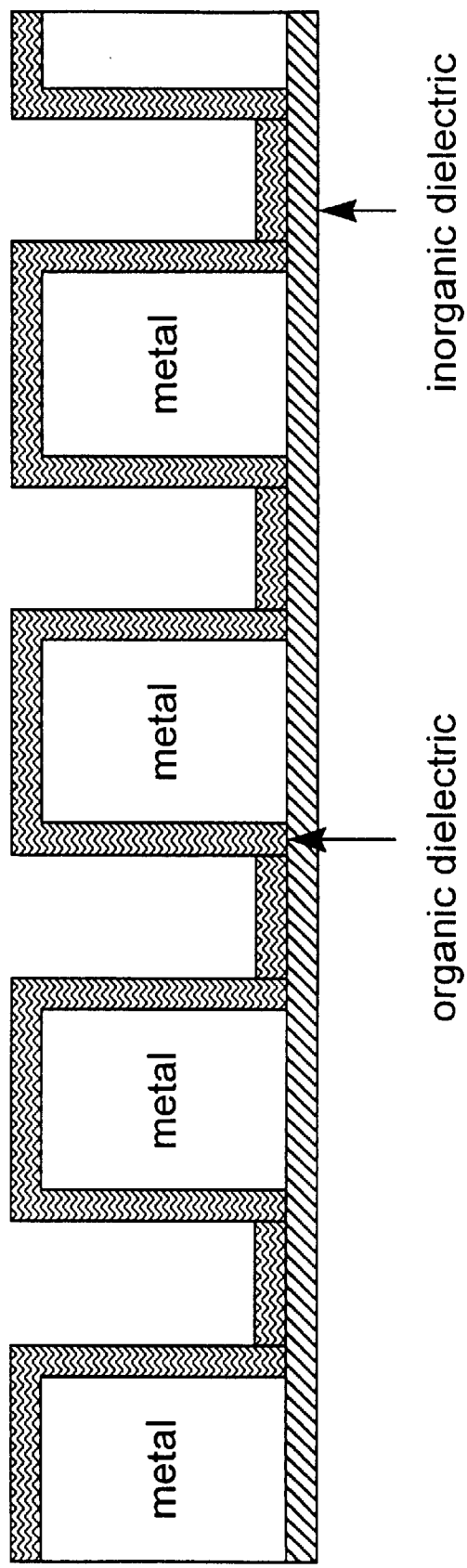

FIG. 7B shows the formation process resulting after conformal deposition of an organic dielectric.

Figure 7C:
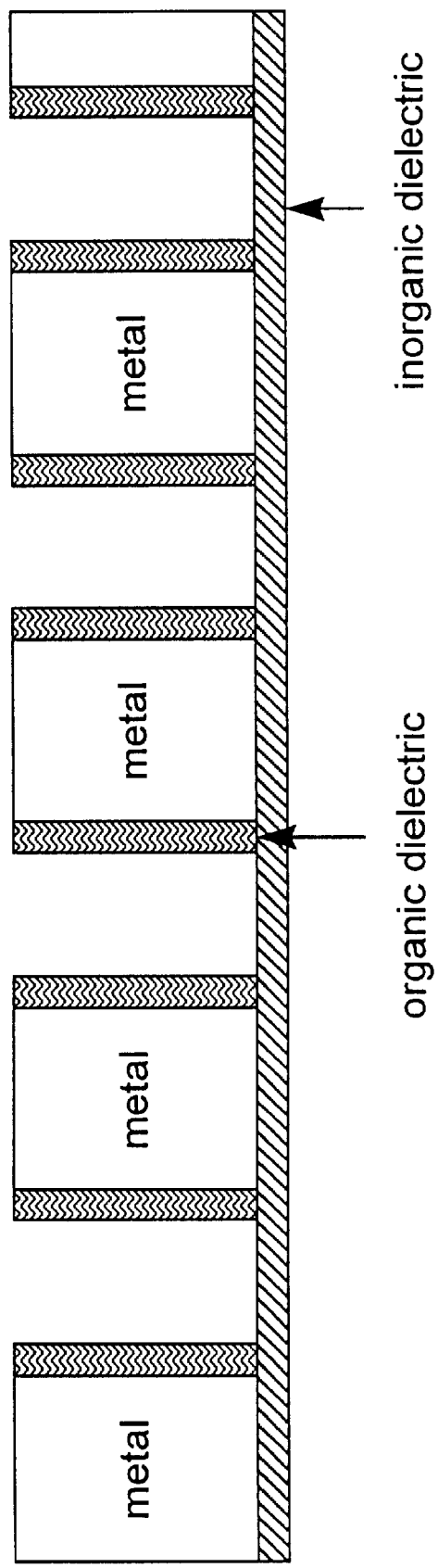

FIG. 7C shows the formation process resulting after anisotropic organic dielectric etchback.

Figure 7D:
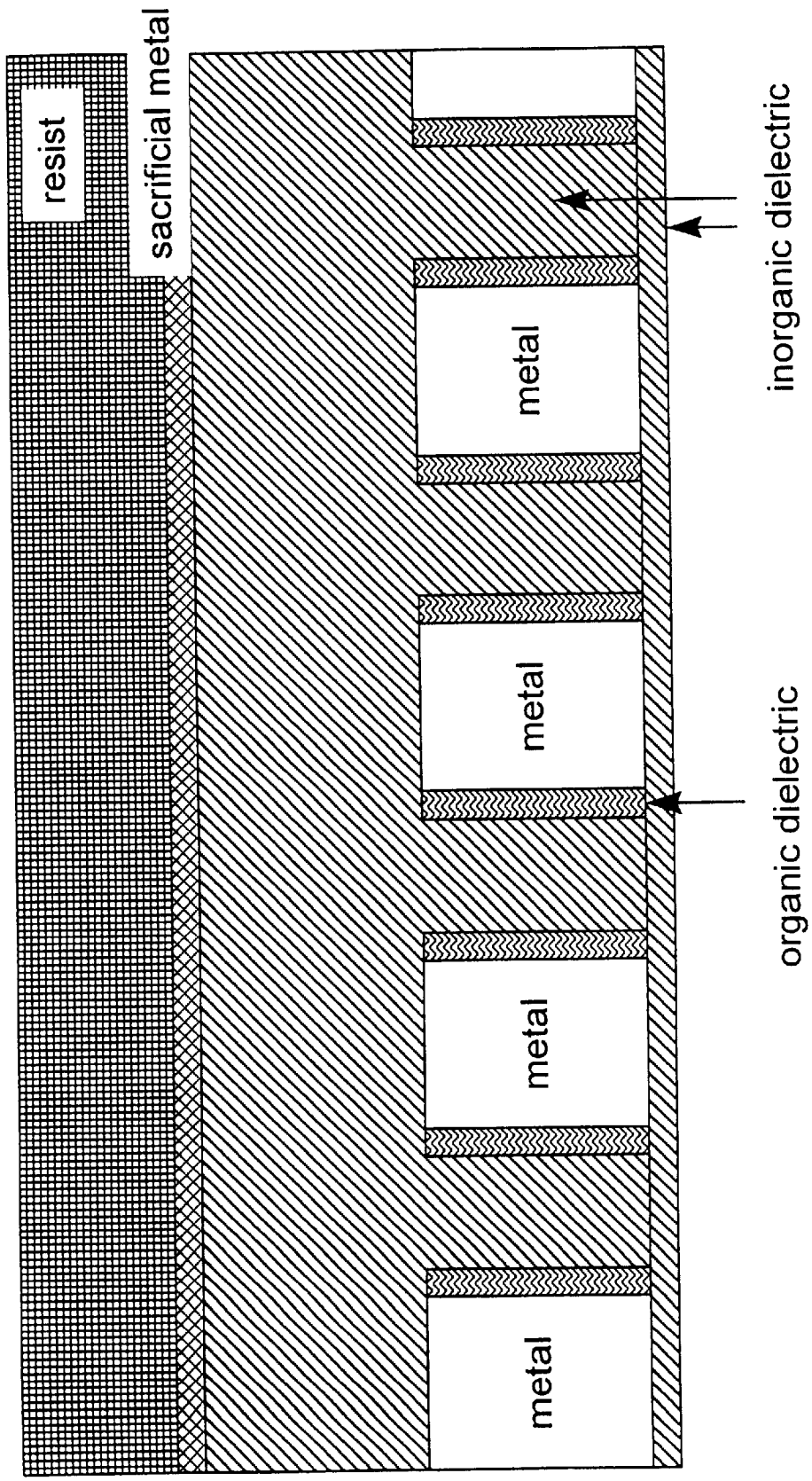

FIG. 7D shows the formation process resulting after inorganic dielectric deposition, sacrificial metal deposition, resist spin and bake.

Figure 7E:
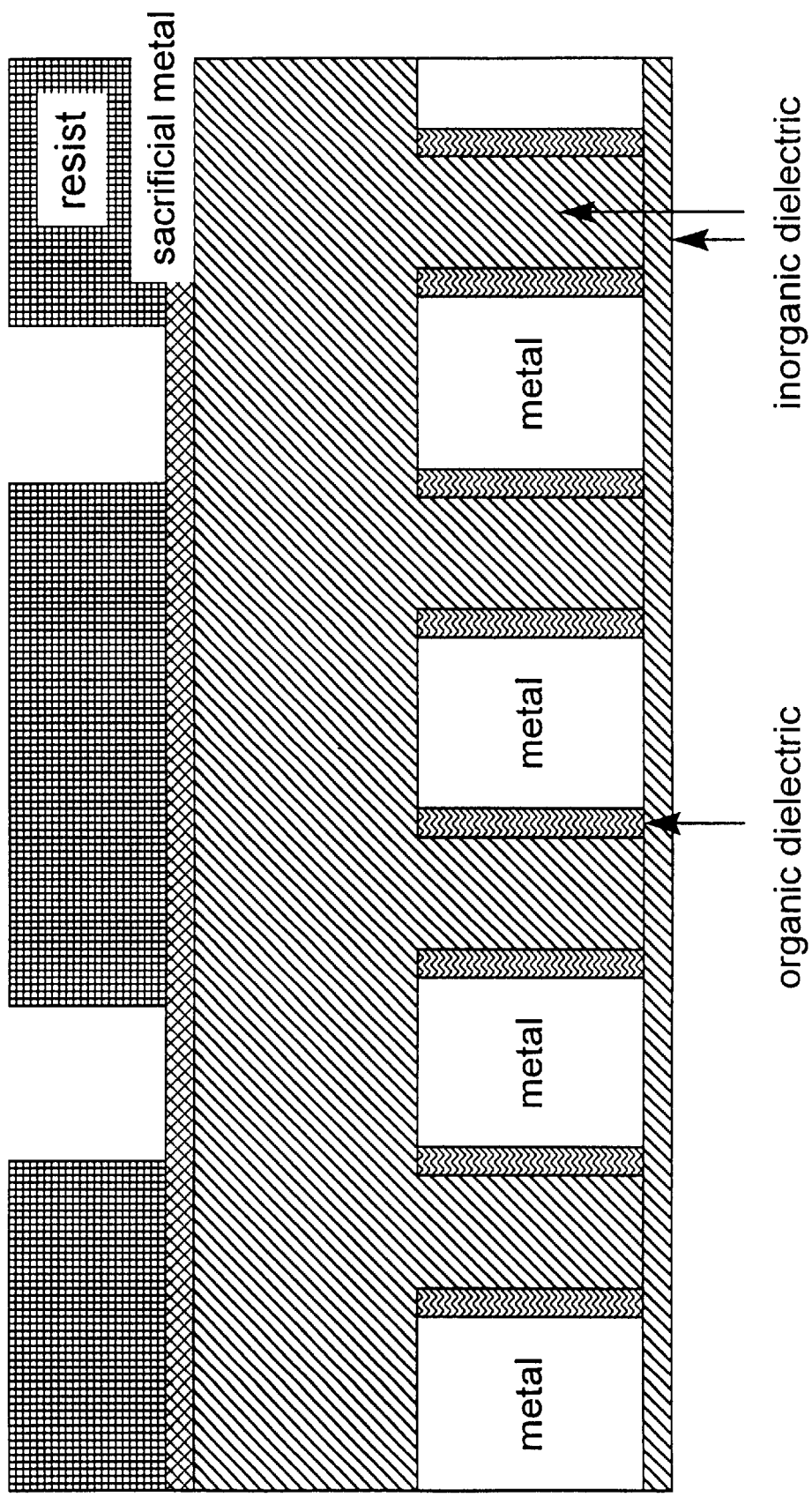

FIG. 7E shows the formation process resulting after via mask and resist development.

Figure 7F:
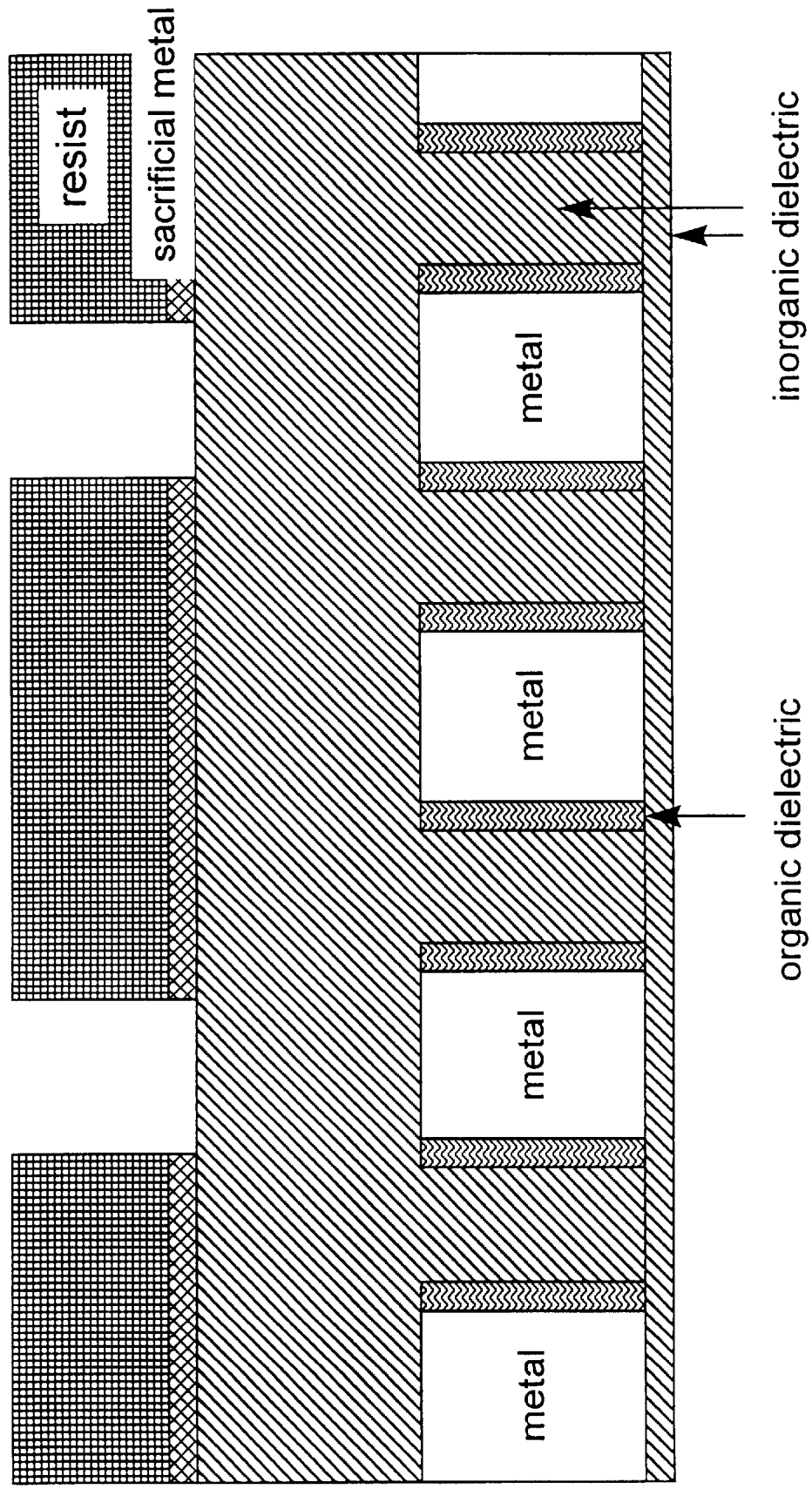

FIG. 7F shows the formation process resulting after anisotropic sacrificial metal etch.

Figure 7G:
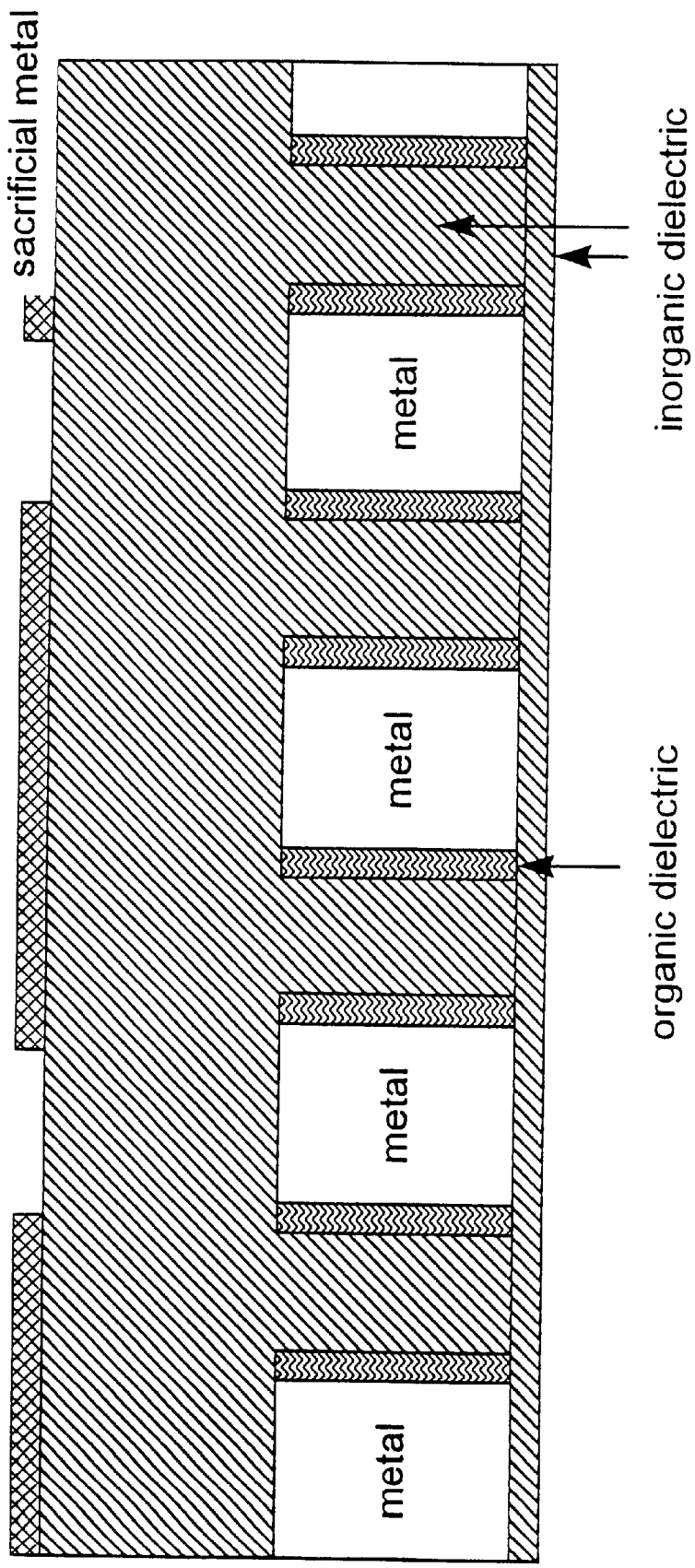

FIG. 7G shows the formation process resulting after resist removal.

Figure 7H:
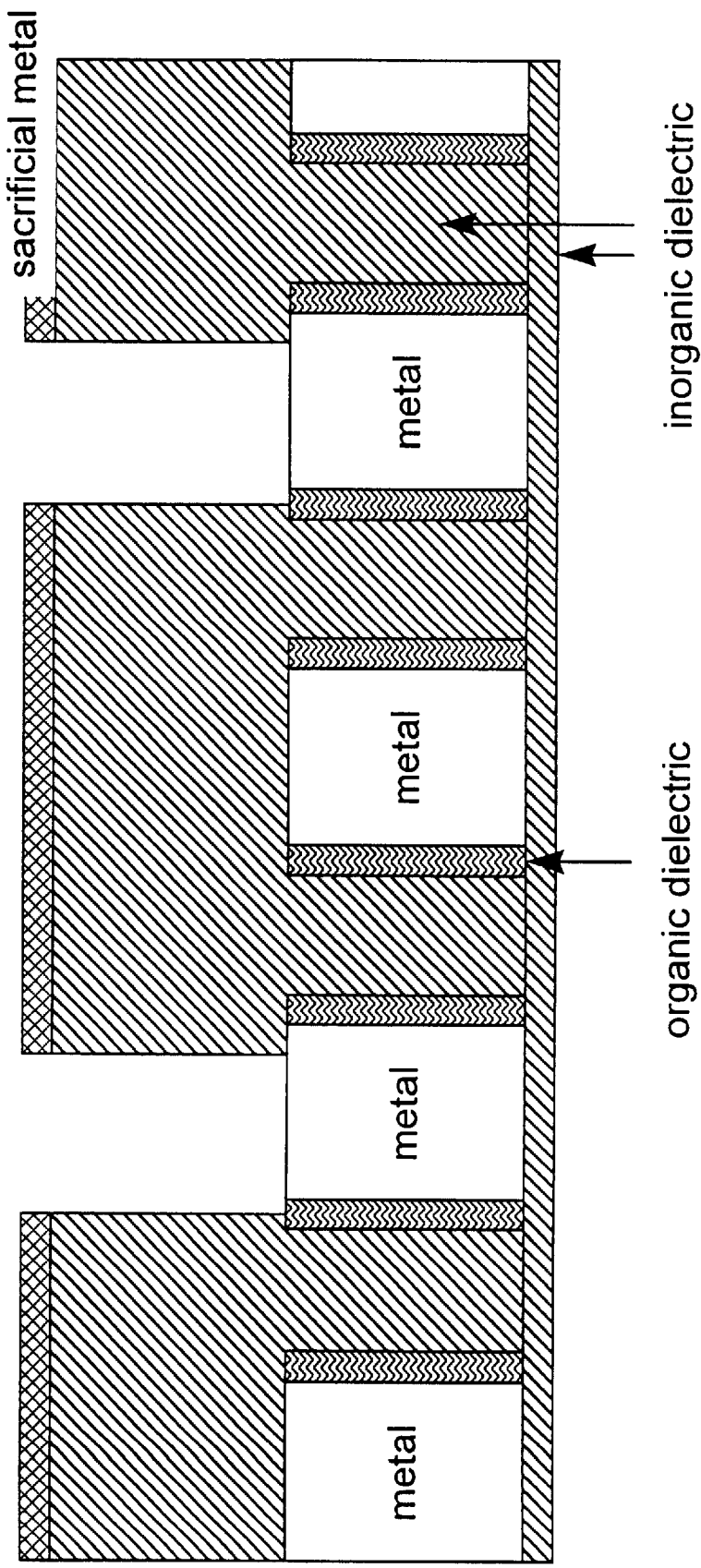
Figure 71:
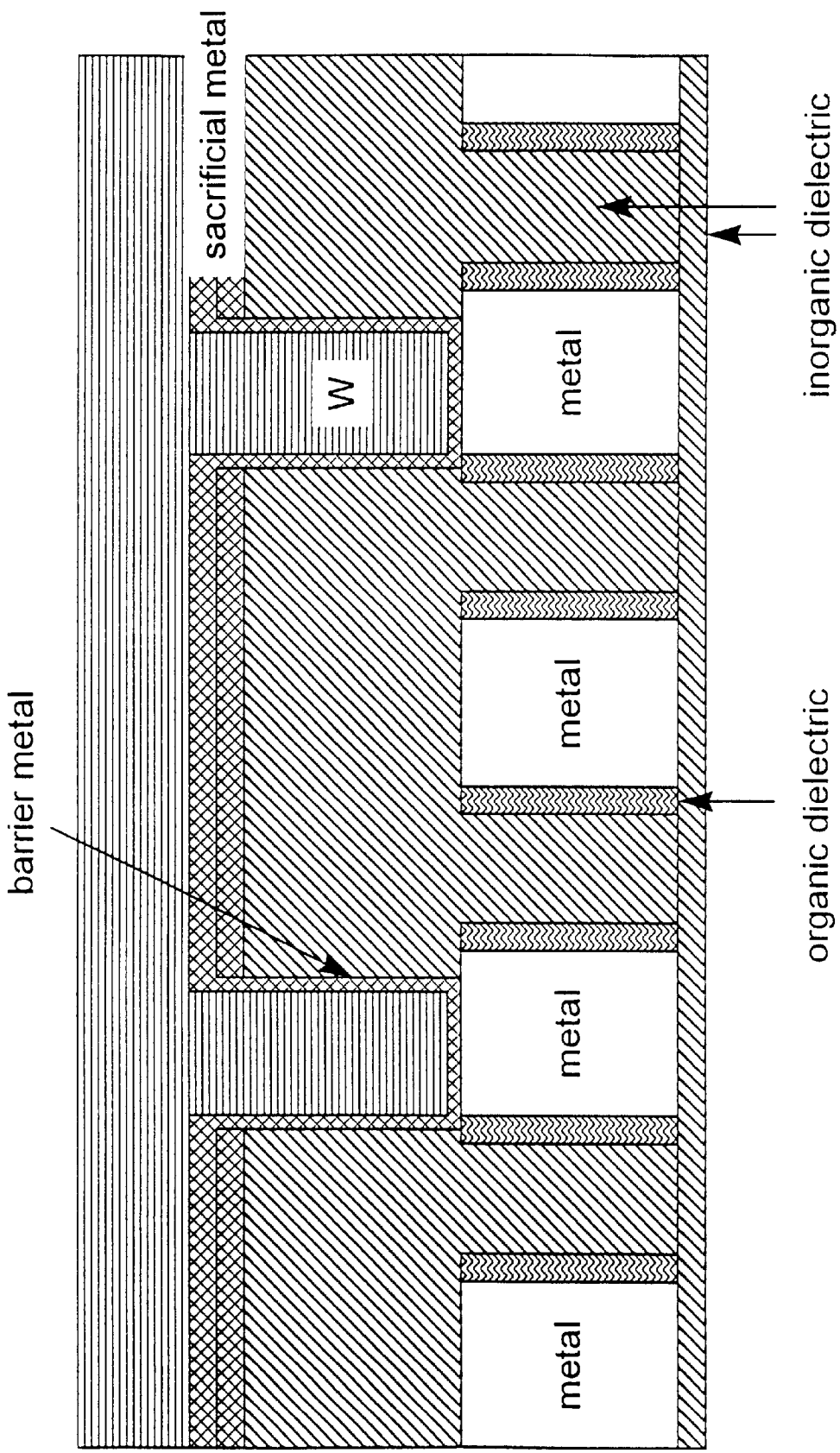

FIG. 7H shows the formation process resulting after anisotropic inorganic dielectric etch.

FIG. 7I shows the formation process resulting after barrier metal and tungsten depositions.

Figure 7J:
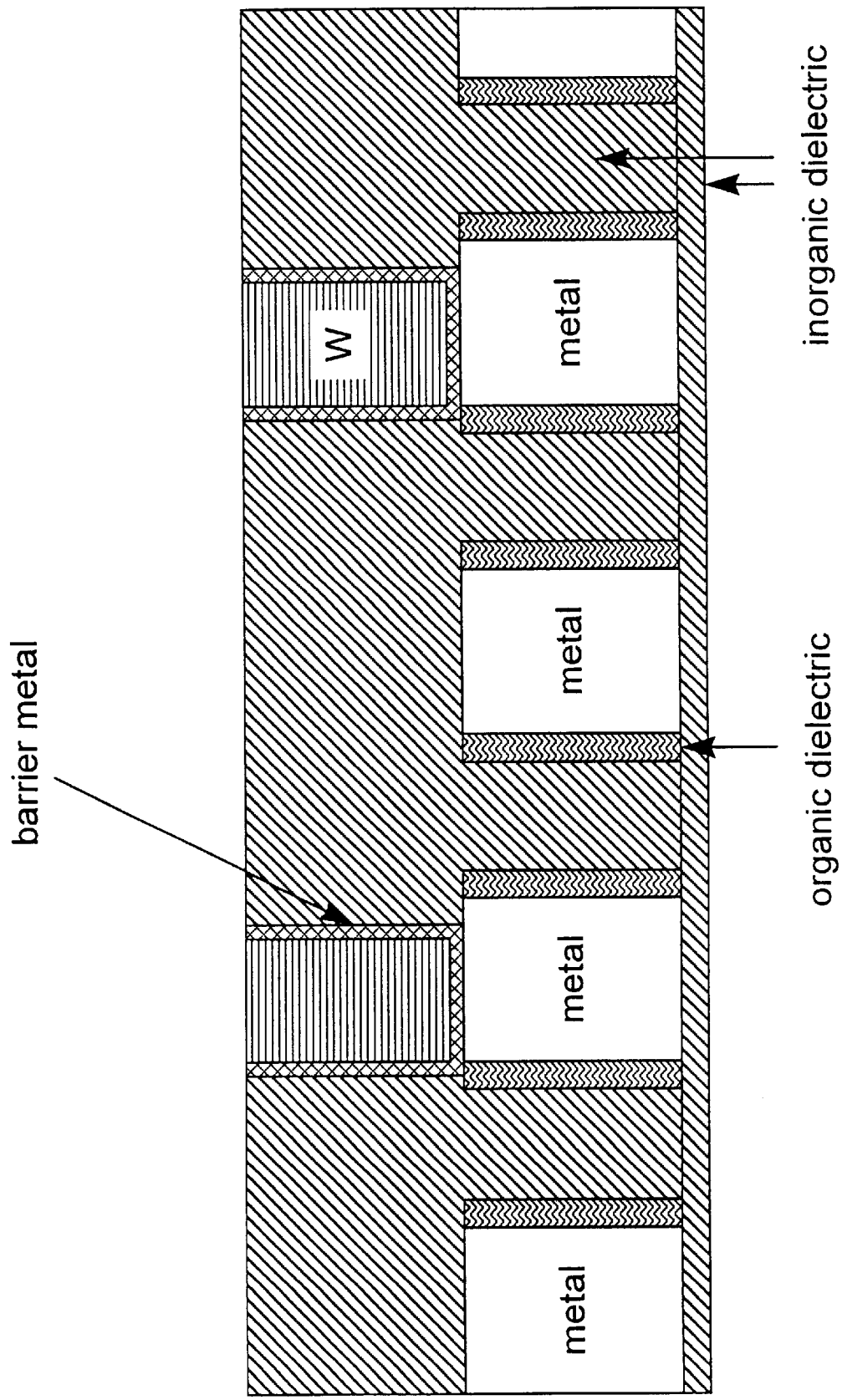

FIG. 7J shows the formation process resulting after chemical mechanical polishing of the tungsten, barrier metal and sacrificial metal.

Figure 8:
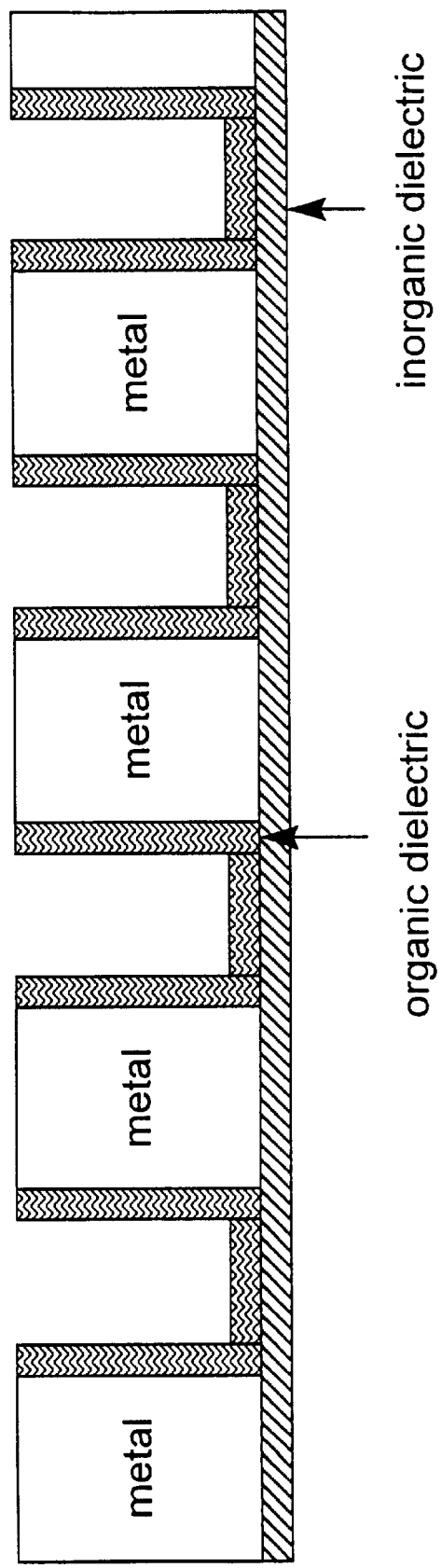

FIG. 8 shows a formation process step for a sixth embodiment of the invention, architecture VI resulting after chemical mechanical polishing of the inorganic dielectric. Prior steps are analogous to FIGS. 7A–7B and subsequent steps are analogous to FIGS. 7D–7G.

DETAILED DESCRIPTION OF THE PREFERRED EMBODIMENT

Figure 1A:
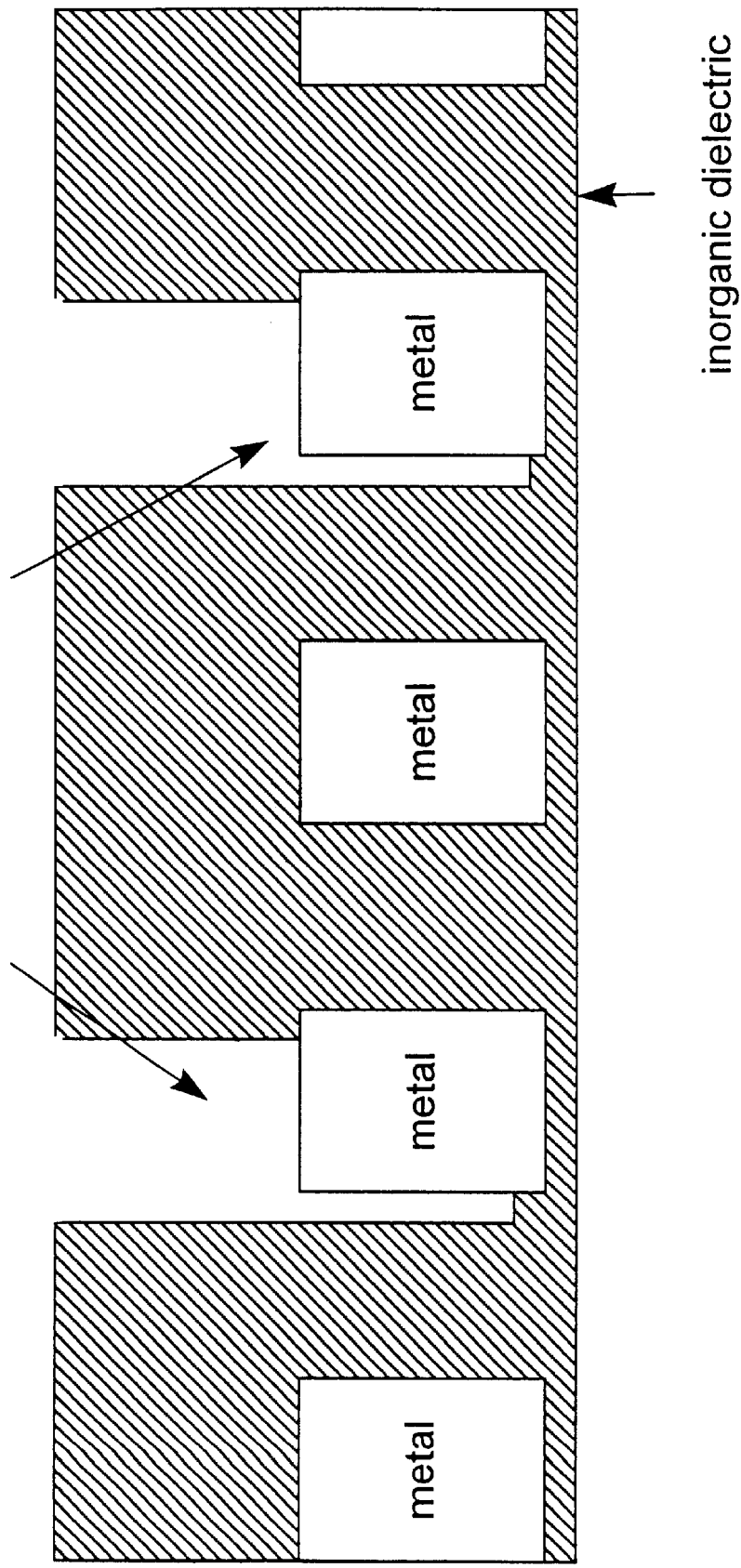
FIG. 1A shows a conventional prior art integrated circuit architecture I.
Figure 1B:
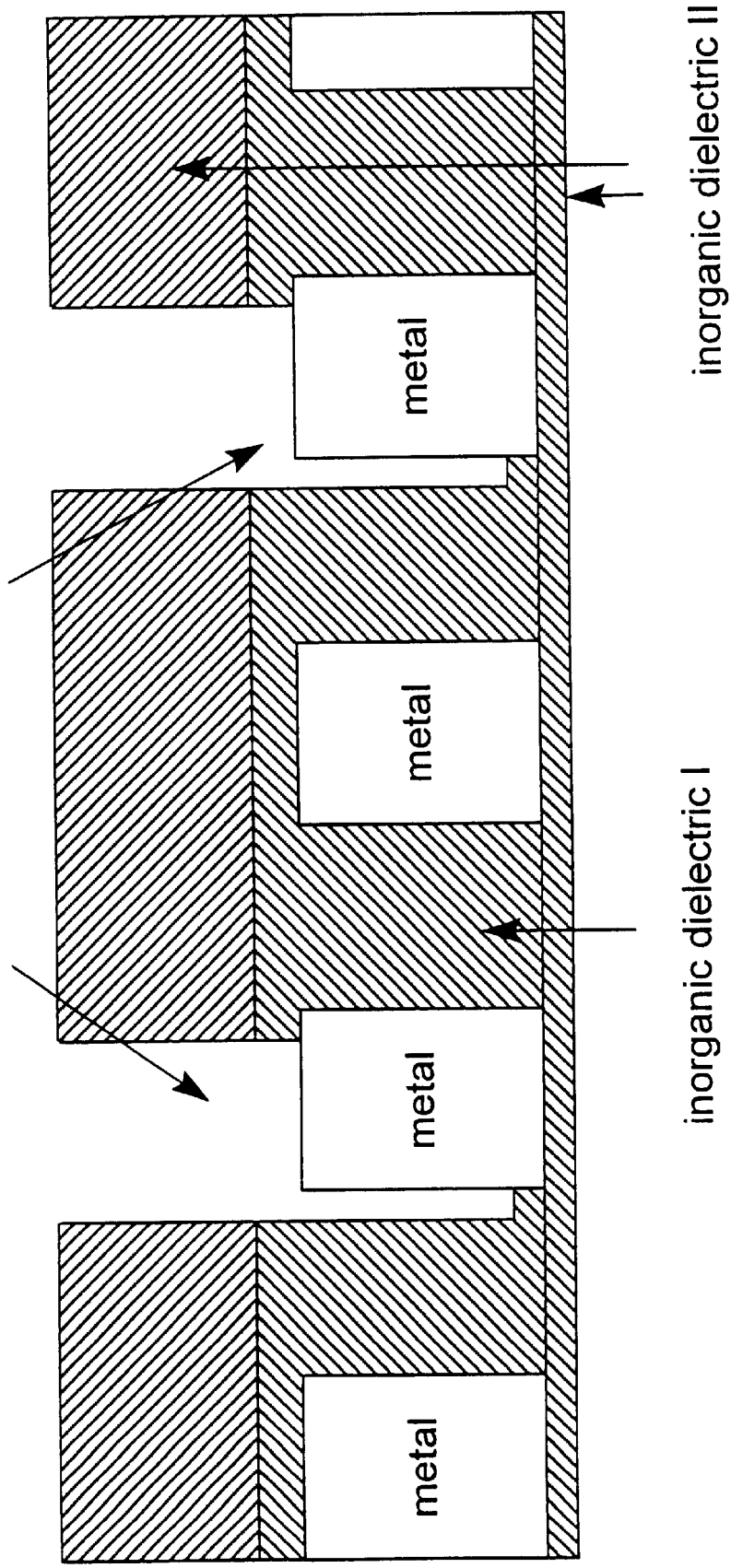
FIG. 1B shows a second conventional prior art integrated circuit architecture II.
Figure 1C:
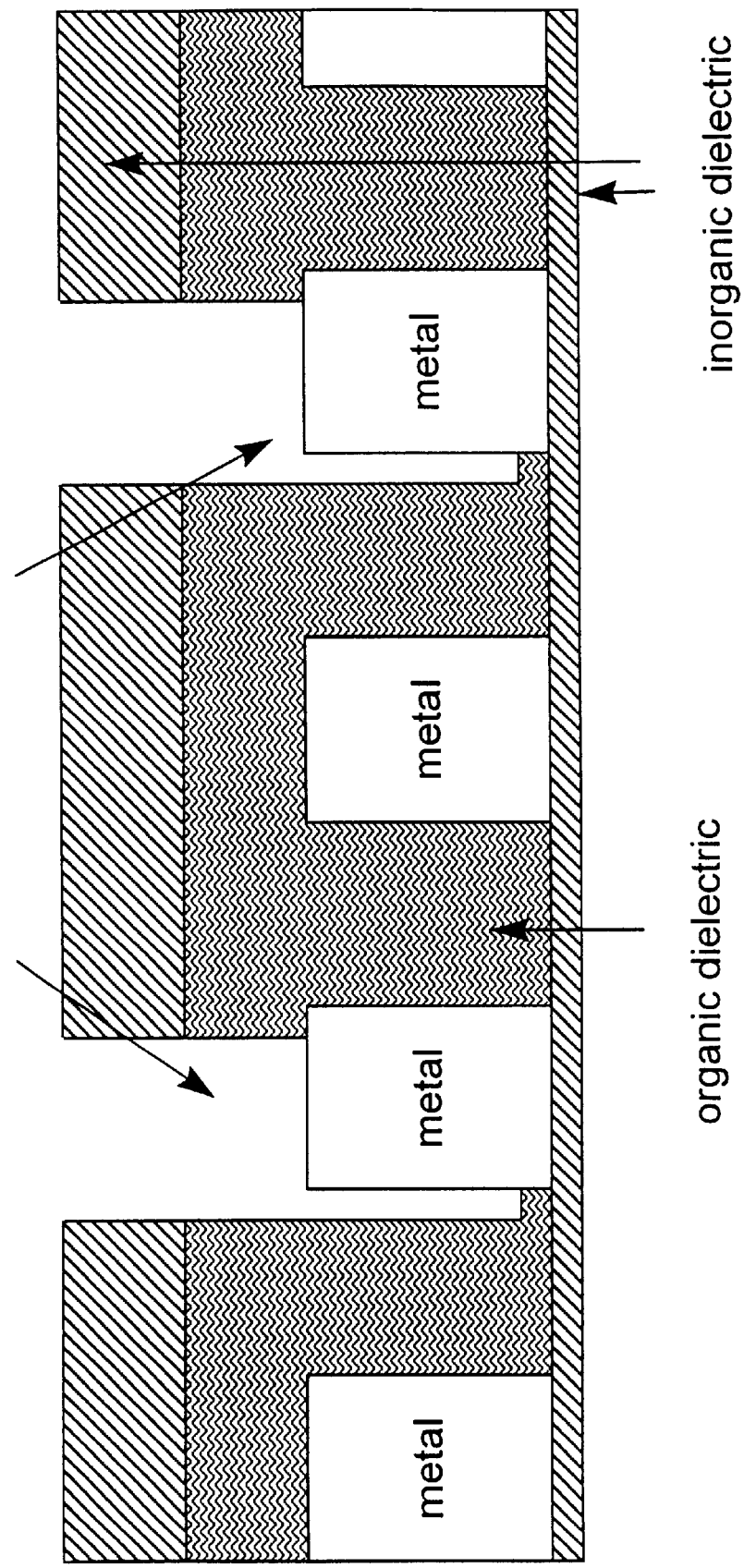
FIG. 1C shows a third conventional prior art integrated circuit architecture III.

FIGS. 1A–C show conventional prior art integrated circuit architectures I, II and III and illustrate the problem of producing borderless vias. As can be seen, deep and narrow trenches are typically produced at the side of metal lines in via etching whenever vias are misaligned to the underlying metal lines. According to the present invention, a metal level dielectric lining is formed at the sides of the metal lines and the area between adjacent linings and above metal contacts is filled with a different metal level dielectric whose etch resistance properties is significantly different from those of the metal level dielectric lining. Six architecture embodiments are illustrated in FIGS. 2A through 2F.

Figure 2A:
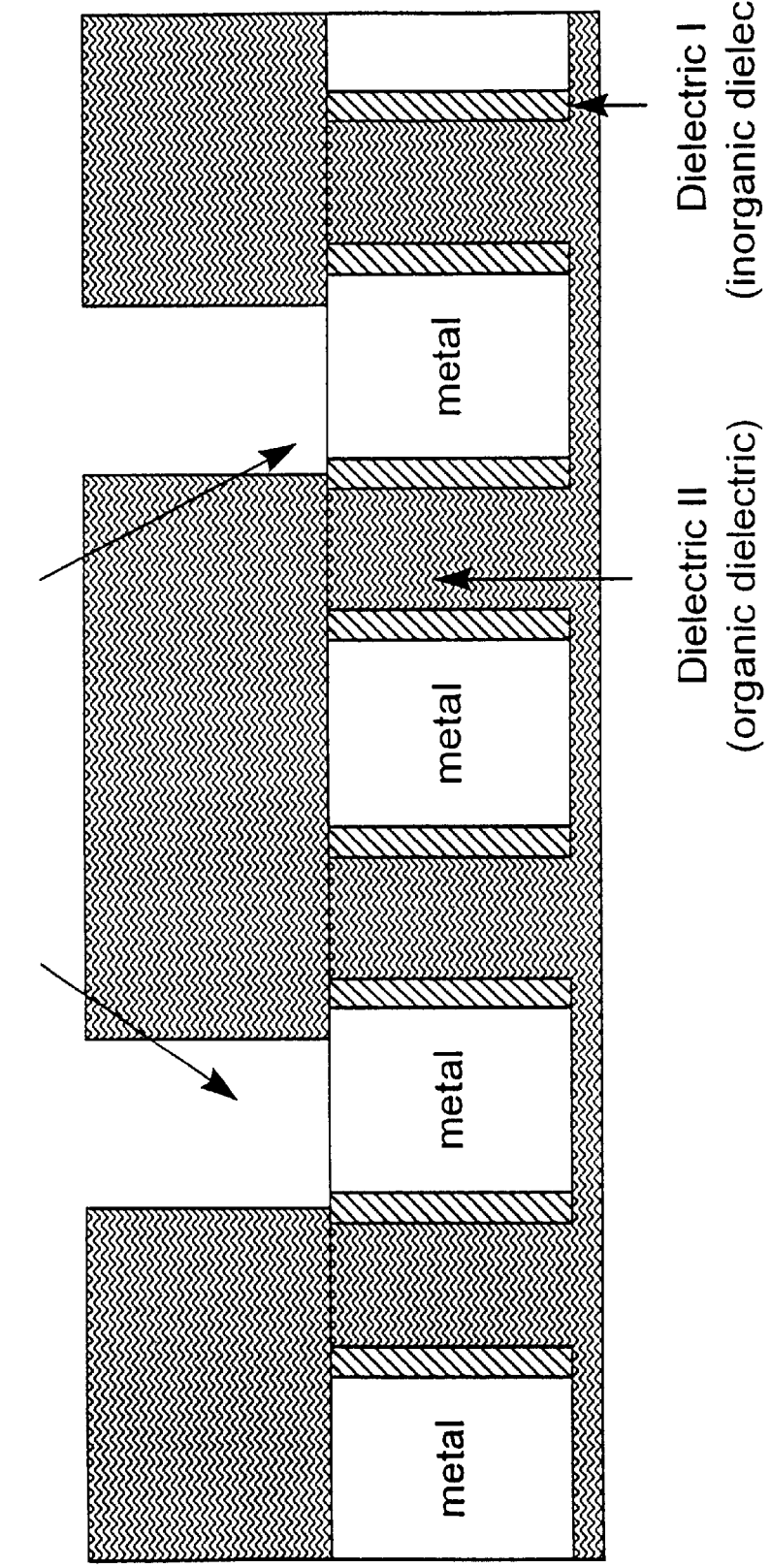
FIG. 2A shows a first embodiment of a new integrated circuit architecture I according to the invention.
Figure 2B:
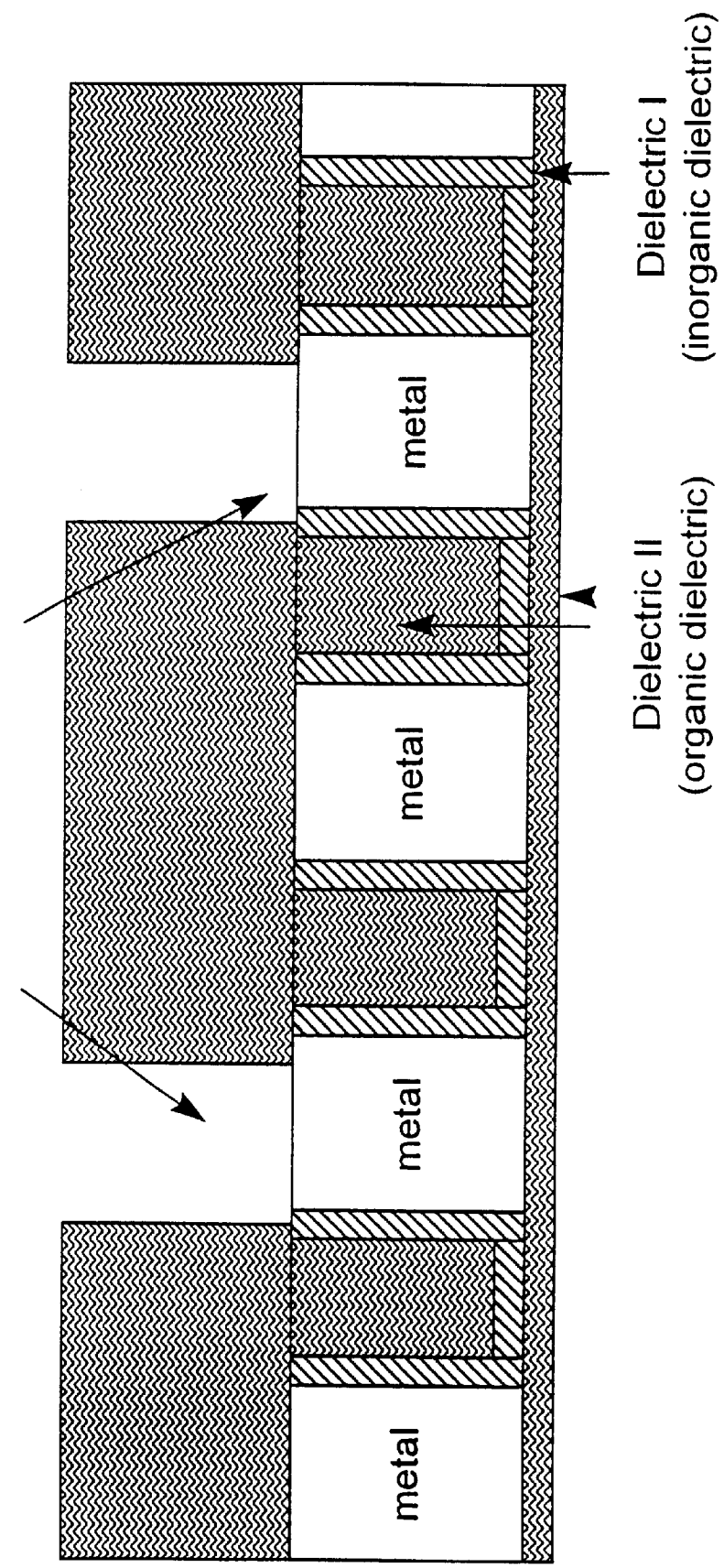
FIG. 2B shows a second embodiment of a new integrated circuit architecture II according to the invention.

The first integrated circuit architecture I according to the invention is show in FIG. 2A. It comprises a base substrate (not shown) and a layer of a second dielectric material (Dielectric II) on the substrate. It is to be understood that as used in this invention, Dielectric I is substantially different in etch resistant properties from Dielectric II. As described hereinafter Dielectric I is substantially different in etch resistant properties from Dielectric III. A plurality of spaced apart metal contacts are on the layer of the second dielectric material. The metal contacts have side walls, and a lining of a first dielectric (Dielectric I) on the side walls. The spaces between the linings on adjacent metal contact side walls are filled with the second dielectric material. The top surface of each of the metal contacts, the top surface of the linings and the top surface of the filled spaces are at a common level. An additional layer of the second dielectric material is positioned on at least some of the metal contacts, linings and filled spaces. At least one via extends through the additional layer of the second dielectric material and extends to the top surface of at least one metal contact and optionally at least one of the linings as shown. Although this application refers to at least one via, in actuality, there are many vias and all are open to extend down to their underlying metal contacts. The purpose of each via is to extend to the underlying metal contacts, however, the via may touch the linings on its corresponding contact. The purpose of the lining is to prevent removal of the dielectric material between contacts in the event the via is misaligned with the metal. FIG. 2B shows an embodiment where the floor of the space between the linings on the metal contacts is also provided with a layer of Dielectric I.

This structure uses two different kinds of low-k dielectric thin films for the IMD. One of Dielectric I and Dielectric II is organic and the other is inorganic. That is, if Dielectric I is organic then Dielectric II is inorganic and if Dielectric I is inorganic then Dielectric I is organic. The process steps used for the fabrication of the via and metal levels can be repeated again for the upper levels of vias and metals. The advantage of the invention is a significant difference in plasma etch rate between organic and inorganic dielectrics. This is not possible when the same dielectric is employed for both via-level and metal-level IMD☐. In oxygen-based plasmas, organic dielectrics etch tremendously faster than inorganic dielectrics. Inversely, in carbon fluoride based plasmas, inorganic dielectrics etch much faster than organic dielectrics.

A first process embodiment of the invention for producing the architecture of FIG. 2A is exemplified by FIGS. 3A through 3I. These figures show the process flow after the formation of the one interconnect level, however, the same processing steps can be repeated again for upper levels of vias and interconnects. FIG. 3A shows the interim structure at a beginning step which is a deposition of an organic low-k dielectric (Dielectric II) onto a substrate and forming a pattern of metal contacts on the layer of the second dielectric material. Typical substrates include those suitable to be processed into an integrated circuit or other microelectronic device. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon dioxide ($SiO_2$) and mixtures thereof. The metal contact lines are typically formed by well known lithographic techniques. Suitable materials for the lines include aluminum, aluminum alloys, copper, copper alloys, titanium, tantalum, and tungsten. These lines form the conductors of an integrated circuit. Such are typically closely separated from one another at distances preferably of from about 20 micrometers or less, more preferably from about 1 micrometer or less, and most preferably of from about 0.05 to about 1 micrometer.

The first process step is to conformally deposit a lining of a first dielectric material (Dielectric I) on side walls of the metal contacts, as well as on a top surface of the metal contacts, and on a floor of a space between the metal contacts on the layer of the second dielectric material as shown in FIG. 3B. The organic and inorganic dielectric compositions may comprise any of a wide variety of dielectric forming materials which are well known in the art for use in the formation of microelectronic devices. The dielectric layers may nonexclusively include silicon containing spin-on glasses, i.e. silicon containing polymer such as an alkoxysilane polymer, a silsesquioxane polymer, a siloxane polymer; a poly(arylene ether), a fluorinated poly(arylene ether), other polymeric dielectric materials, nanoporous silica or mixtures thereof. The only criteria for this invention is that organic dielectrics are formed adjacent to inorganic dielectrics. Useful organic dielectrics are those which follow which are carbon containing and inorganics are those which follow which are not carbon containing.

One useful polymeric dielectric material useful for the invention include an nanoporous silica alkoxysilane polymer formed from an alkoxysilane monomer which has the formula:

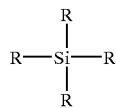

wherein at least 2 of the R groups are independently $C_1$ to $C_4$ alkoxy groups and the balance, if any, are independently selected from the group consisting of hydrogen, alkyl, phenyl, halogen, substituted phenyl. Preferably each R is methoxy, ethoxy or propoxy. Such are commercially available from AlliedSignal as Nanoglass™. The most preferred alkoxysilane monomer is tetraethoxysilane (TEOS). Also useful are hydrogensiloxanes which have the formula $[(HSiO_{1.5})_xO_y]_n$, hydrogensilsesquioxanes which have the formula $(HSiO_{1.5})_n$, and hydroorganosiloxanes which have the formulae $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$. In each of these polymer formulae, x=about 6 to about 20, y=1 to about 3, z=about 6 to about 20, n=1 to about 4,000, and each R is independently H, $C_1$ to $C_8$ alkyl or $C_6$ to $C_{12}$ aryl. The weight average molecular weight may range from about 1,000 to about 220,000. In the preferred embodiment n ranges from about 100 to about 800 yielding a molecular weight of from about 5,000 to about 45,000. More preferably, n ranges from about 250 to about 650 yielding a molecular weight of from about 14,000 to about 36,000. Useful polymers within the context of this invention nonexclusively include hydrogensiloxane, hydrogensilsesquioxane, hydrogenmethylsiloxane, hydrogenethylsiloxane, hydrogenpropylsiloxane, hydrogenbutylsiloxane, hydrogentert-butylsiloxane, hydrogenphenylsiloxane, hydrogenmethylsilsesquioxane, hydrogenethylsilsesquioxane, hydrogenpropylsilsesquioxane, hydrogenbutylsilsesquioxane, hydrogentert-butylsilsesquioxane and hydrogenphenylsilsesquioxane and mixtures thereof. Useful organic polymers include polyimides, fluorinated and nonfluorinated polymers, in particular fluorinated and nonfluorinated poly(arylethers) available under the tradename FLARE™ from AlliedSignal Inc., and copolymer mixtures thereof. The hydroorganosiloxanes, poly(arylene ethers), fluorinated poly(arylene ethers) and mixtures thereof are preferred. Suitable poly(arylene ethers) or fluorinated poly(arylene ethers) are known in the art from U.S. Pat. Nos. 5,155,175; 5,114,780 and 5,115,082. Preferred poly(arylene ethers) and fluorinated poly(arylene ethers) are disclosed in U.S. patent application Ser. No. 08/990,157 filed Dec. 12, 1997 which is incorporated herein by reference. Preferred siloxane materials suitable for use in this invention are commercially available from AlliedSignal Inc. under the tradename Accuglass™T-11, T-12 and T-14. Also useful are methylated siloxane polymers available from AlliedSignal Inc. under the tradenames Purespin™ and Accuspin™T18, T23 and T24.

Preferred silicon containing dielectric resins include polymers having a formula selected from the group consisting of $[(HSiO_{1.5})_xO_y]_n$, $(HSiO_{1.5})_n$, $[(HSiO_{1.5})_xO_y(RSiO_{1.5})_z]_n$, $[(HSiO_{1.5})_x(RSiO_{1.5})_y]_n$ and $[(HSiO_{1.5})_xO_y(RSiO_{1.5})_z]_n$ wherein x=about 6 to about 20, y=1 to about 3, z=about 6 to about 20, n=1 to about 4,000, and each R is independently H, $C_1$ to $C_8$ alkyl or $C_6$ to $C_{12}$ aryl which are disclosed in U.S. patent application Ser. No. 08/955,802 filed Oct. 22, 1997 and which is incorporated herein by reference. Also preferred are certain low organic content silicon containing polymers such as those having the formula I:

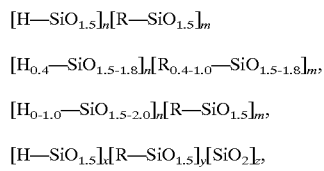

wherein the sum of n and m, or the sum or x, y and z is from about 8 to about 5000, and m and y are selected such that carbon containing substituents are present in an amount of less than about 40 Mole percent. Polymers having the structure I are of low organic content where the carbon containing substituents are present in an amount of less than about 40 mole percent. These polymers are described more fully in U.S. patent application Ser. No. 09/044,831, filed Mar. 20, 1998, which is incorporated herein by reference. Also preferred are certain high organic content silicon containing polymers such as those having the formula II:

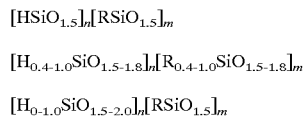

wherein the sum of n and m is from about 8 to about 5000 and m is selected such that the carbon containing substituent is present in an amount of from about 40 □ole percent or greater; and

wherein the sum of x, y and z is from about 8 to about 5000 and y is selected such that the carbon containing substituent is present in an amount of about 40 □ole % or greater; and wherein R is selected from substituted and unsubstituted straight chain and branched alkyl groups, cycloalkyl groups, substituted and unsubstituted aryl groups, and mixtures thereof. The specific mole percent of carbon containing substituents is a function of the ratio of the amounts of starting materials. Polymers having the structure II which are of high organic content where the carbon containing substituents are present in an amount of about 40 mole percent or more. These polymers are described more fully in U.S. patent application Ser. No. 09/044,798, filed Mar. 20, 1998, which is incorporated herein by reference.

The polymer may be present in the dielectric composition in a pure or neat state (not mixed with any solvents) or it may be present in a solution where it is mixed with solvents. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 80% to about 97%. Suitable solvents nonexclusively include aprotic solvents such as cyclic ketones including cyclopentanone, cyclohexanone, cyclohexanone and cyclooctanone; cyclic amides such as N-alkylpyrrolidinone wherein the alkyl group has from 1 to about 4 carbon atoms, and N-cyclohexyl-pyrrolidinone, and mixtures thereof.

Deposition of the dielectric onto the substrate may be conducted via conventional spin-coating, dip coating, roller coating, spraying, chemical vapor deposition methods, or meniscus coating methods which are well-known in the art. Spin coating is most preferred. The thickness of the dielectric layers may vary depending on the deposition procedure and parameter setup, but typically the thickness may range from about 500 Å to about 50,000 Å, and preferably from about 2000 Å to about 12000 Å. In the preferred embodiment, a liquid dielectric composition is spun onto the appropriate surface according to known spin techniques such as by applying a liquid dielectric composition to the surface and then spinning on a rotating wheel at speeds ranging from about 500 to about 6000 rpm for about 5 to about 60 seconds. The layer preferably has a density of from about 1 $g/cm^3$ to about 3 $g/cm^3$.

The dielectric lining on the metal contacts may be conformal deposited using chemical vapor deposition techniques. The as-deposited thickness of the dielectric is required to be that its thickness on the sidewall of metal lines is no less than the allowable misalignment between the subsequently printed via and the metal lines underneath it. On the other hand, the dielectric needs be kept thin enough so that no keyholes are formed in it.

The dielectrics may optionally be heated to expel residual solvent or to increase its molecular weight. The heating may be conducted by conventional means such as heating on a hot plate in air or in an inert atmosphere, or it may occur in a furnace or oven in air, or in an inert atmosphere, or it may occur in a vacuum furnace or vacuum oven. Heating is preferably conducted at a temperature of from about 80° C. to about 500° C., and more preferably from about 150° C. to about 425° C. This heating is preferably performed from about 1 minute to about 360 minutes, and more preferably from about 2 to about 60 minutes. The dielectric layer may also optionally be exposed to actinic light, such as UV light, to increase its molecular weight. The amount of exposure may range from about 100 $mJ/cm^2$ to about 300 $mJ/cm^2$. The dielectric layers may optionally be cured by overall exposed to electron beam radiation. Electron beam exposure may be controlled by setting the beam acceleration. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision, a unit of Allied-Signal Inc., under the trade name □lectronCure™". The principles of operation and performance characteristics of such device are described in U.S. Pat. No. 5,003,178, the disclosure of which is incorporated herein by reference. The temperature of the electron beam exposure preferably ranges from about 20° C. to about 450° C., more preferably from about 50° C. to about 400° C. and most preferably from about 200° C. to about 400° C. The electron beam energy is preferably from about 0.5 KeV to about 30 KeV, and more preferably from about 3 to about 10 KeV. The dose of electrons is preferably from about 1 to about 50,000 $\mu C/cm^2$ and more preferably from about 50 to about 20,000 $\mu C/cm^2$. The gas ambient in the electron beam tool can be any of the following gases: nitrogen, oxygen, hydrogen, argon, a blend of hydrogen and nitrogen, ammonia, xenon or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches.

Figure 3C:
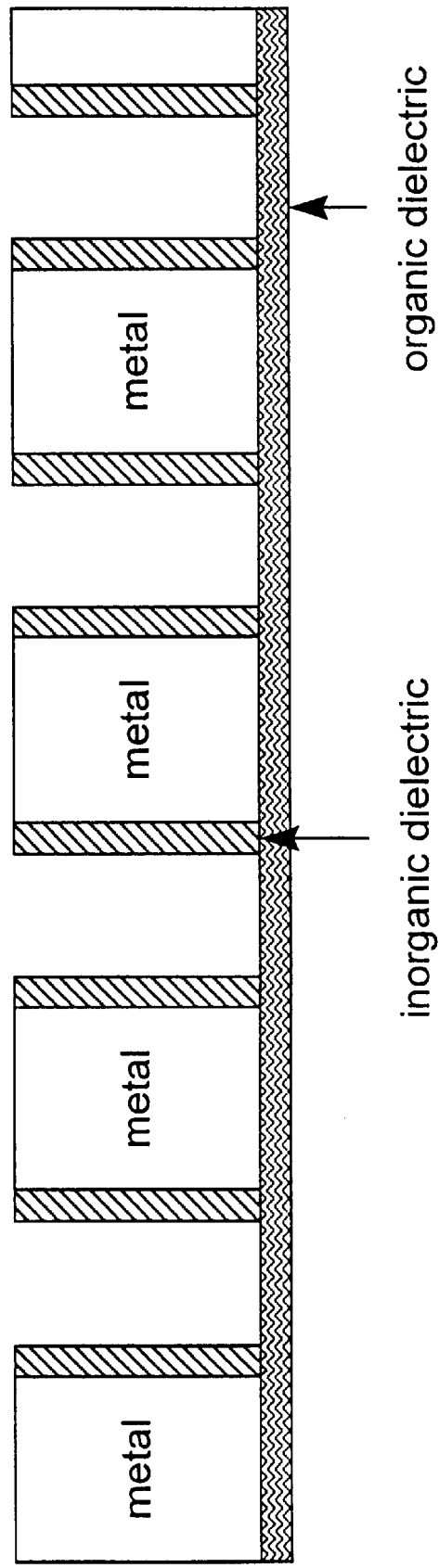
FIG. 3C shows the formation process resulting after anisotropic inorganic dielectric etchback.
Figure 4:
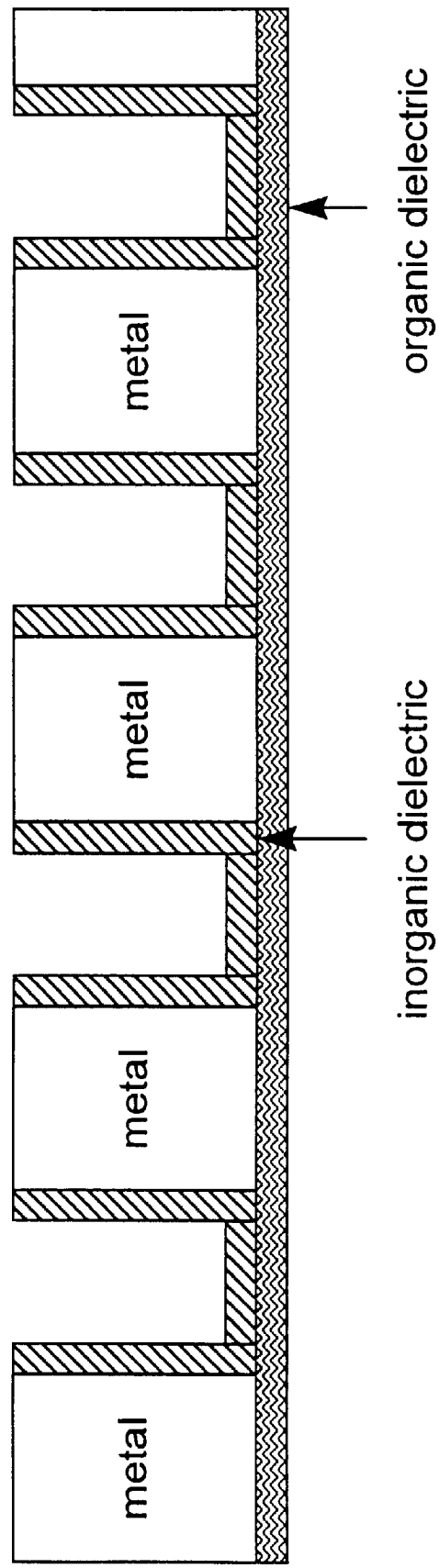
FIG. 4 shows a formation process step for a second embodiment of the invention, architecture II resulting after chemical mechanical polishing of the inorganic dielectric.

The next step 2 is removing the first dielectric material from the top surface of the metal contacts and the floor of the space between adjacent linings while retaining the first dielectric material lining on the side walls of the metal contacts as shown in FIG. 3C. This is done by anisotropic inorganic dielectric etchback. The inorganic dielectric over metal lines is removed and the etchstop for via etch is formed at this step. This step ensures that the dielectric immediately over metal lines can be different from the one on the side of metal lines. The etchback needs be anisotropic and well-controlled to minimize the recess produced by it. The etchback can be performed in fluorine-based plasma chemistry. In an alternate embodiment of the invention, the dielectric is not removed from the floor of the space between adjacent linings as shown in FIG. 4. This retaining of the dielectric on the floor of the space between adjacent linings is used when it is desired to produce architecture II as shown in FIG. 2B.

Figure 3D:
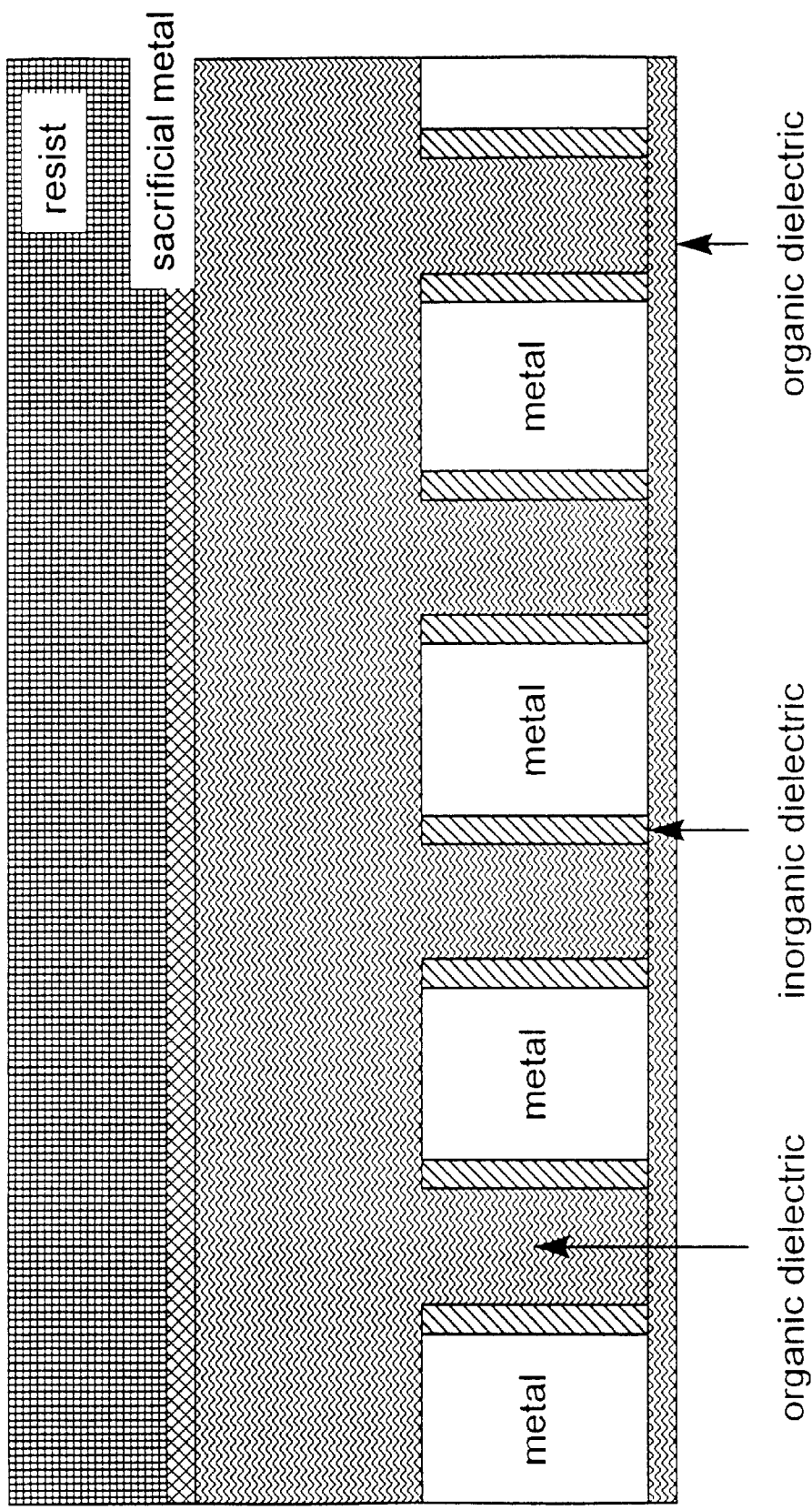
FIG. 3D shows the formation process resulting after organic dielectric deposition, sacrificial metal deposition and resist spin and bake.

Vias are formed in the organic dielectric layer by well known photolithographic techniques. In step 3 one then deposits an additional layer of the second dielectric material on the top surface of the metal contacts and in the space between adjacent linings of the metal contacts. The deposition of this layer ensures that the dielectric immediately over metal lines is different from the dielectric on the sidewall of metal lines. The presence of this organic dielectric makes it possible for the inorganic dielectric on the sidewall of metal lines the etchstop in the subsequent via etch. In step 4 one thereafter deposits a layer of a sacrificial metal on the additional layer of the second dielectric material. This layer separates the underlying organic dielectric previously deposited from the resist to be spun in the next step. Significantly high etch selectivity can be easily achieved between inorganic dielectrics and metal thin film and between organic dielectrics and metal thin films. The sacrificial metal protects the underlying organic dielectric when resist is removed after the completion of opening via. Any suitable etchable metal may be used for this layer such as titanium nitride or tungsten. A layer of a photoresist is then applied and baked on the layer of the sacrificial metal layer. The photoresist composition may be positive working or negative working and are generally commercially available. Suitable positive working photoresists are well known in the art and may comprise an o-quinone diazide radiation sensitizer. The o-quinone diazide sensitizers include the o-quinone-4-or-5-sulfonyl-diazides disclosed in U.S. Pat. Nos. 2,797,213; 3,106,465; 3,148,983; 3,130,047; 3,201,329; 3,785,825; and 3,802,885. When o-quinone diazides are used, preferred binding resins include a water insoluble, aqueous alkaline soluble or swellable binding resin, which is preferably a novolak. Suitable positive photodielectric resins may be obtained commercially, for example, under the trade name of AZ-P4620 from Clariant Corporation of Somerville, N.J. The resulting interim structure is shown in FIG. 3D.

Figure 3E:
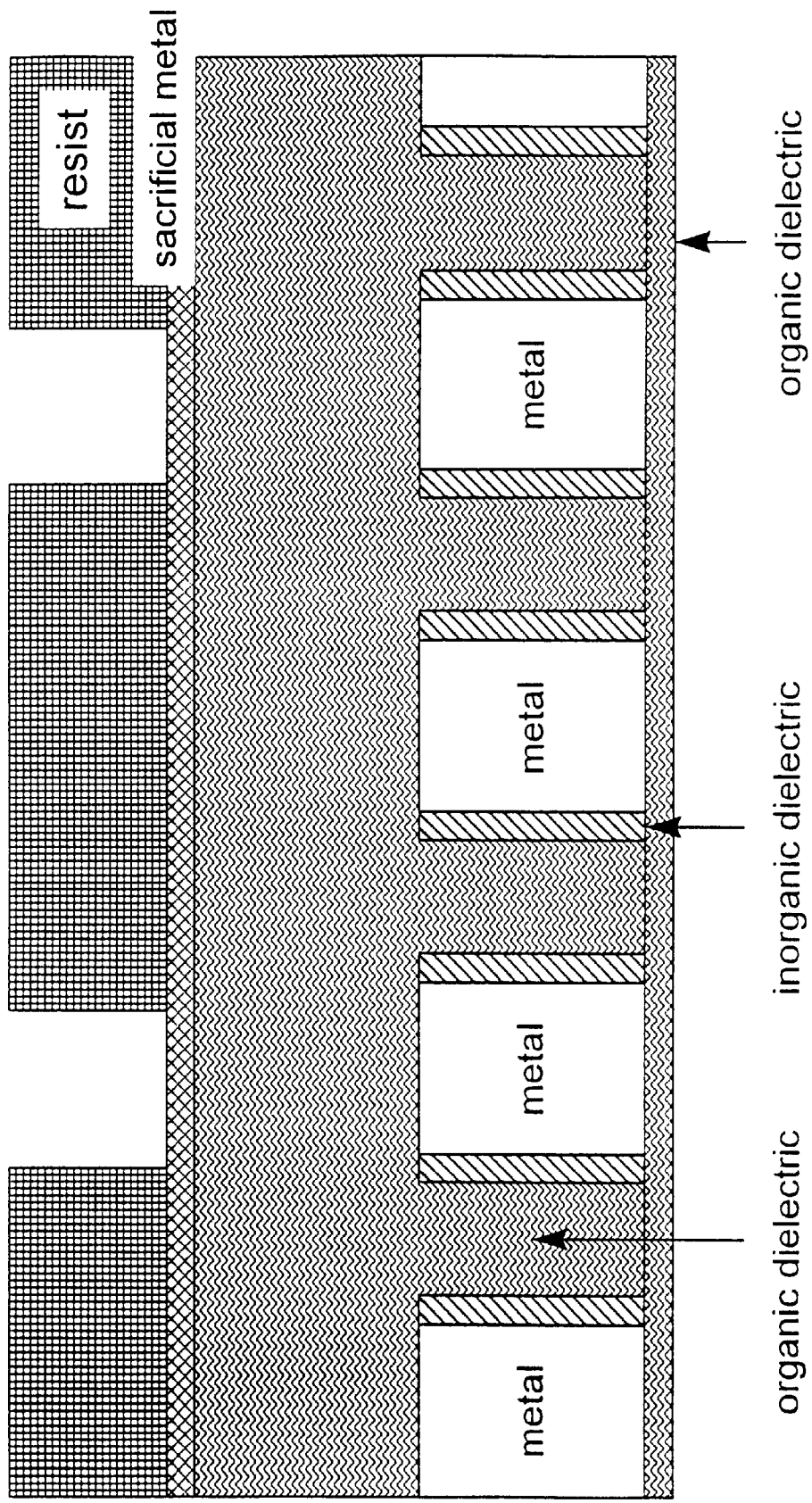
FIG. 3E shows the formation process resulting after via mask and resist development.

After imagewise removing a portion of the photoresist over at least one metal contact and optionally over at least a portion of the lining of first dielectric material on a side wall of a metal contact, the structure of FIG. 3E is obtained. This figure shows the structure after imagewise patterning and removal of portions of the resist in step 6. Such is formed in a manner well known in the art such as by imagewise exposing the photoresist to actinic radiation such as through a suitable mask and developing the photoresist. The photoresist may be imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution. Optionally the photoresist is heated to cure the image portions thereof and thereafter developed to remove the nonimage portions and define a via mask.

Figure 3F:
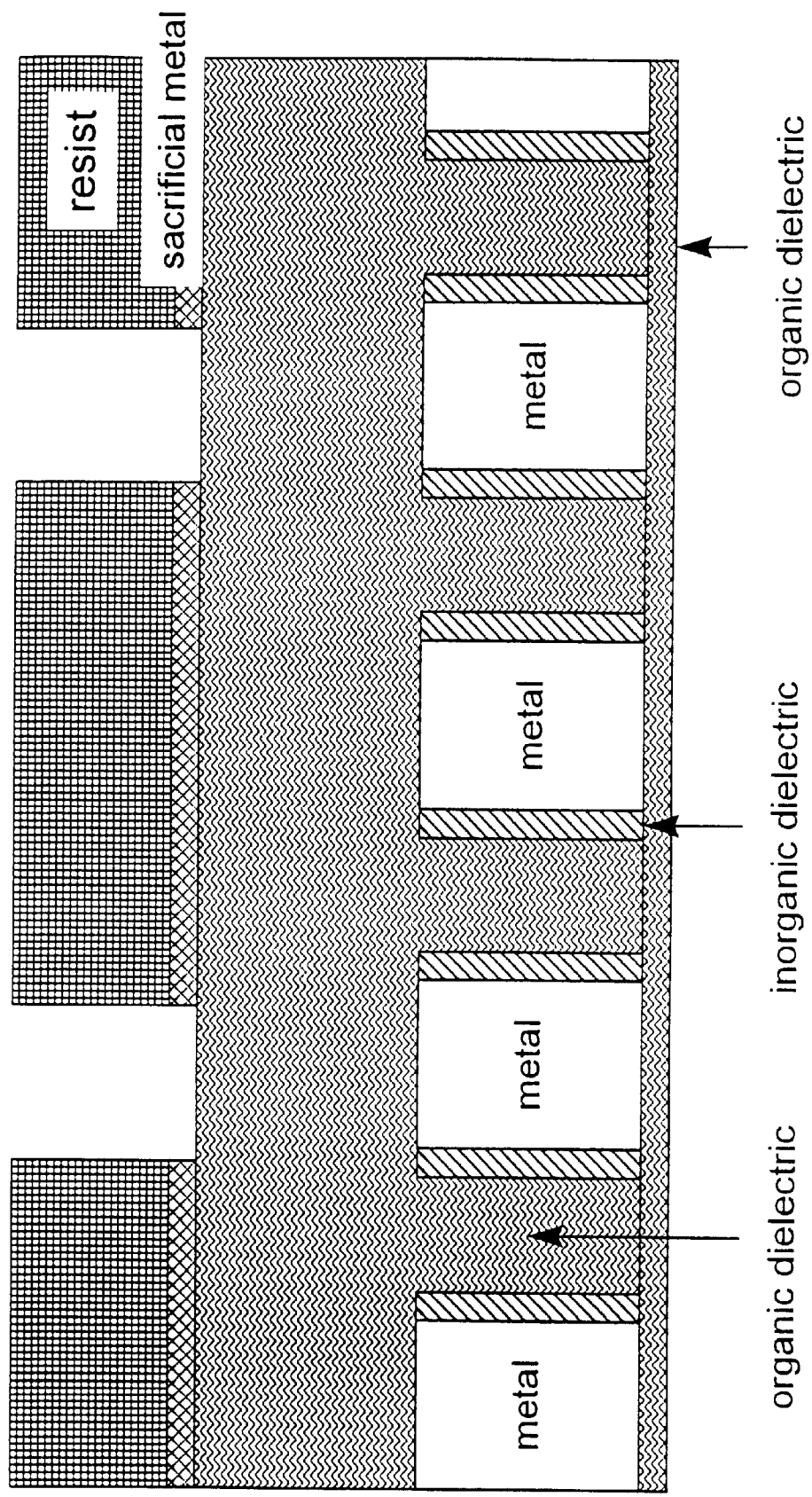
FIG. 3F shows the formation process resulting after anisotropic sacrificial metal etch.

In step 7, after removing the portion of the layer of the sacrificial metal under the removed portion of the photoresist, the structure of FIG. 3F is attained. This is done by anisotropic sacrificial metal etch. The etch, preferably done in chlorine-based plasma chemistry, and stops by itself on reaching the underlying organic dielectric due to a significantly high etch selectivity between metal and the organic dielectric.

Figure 3G:
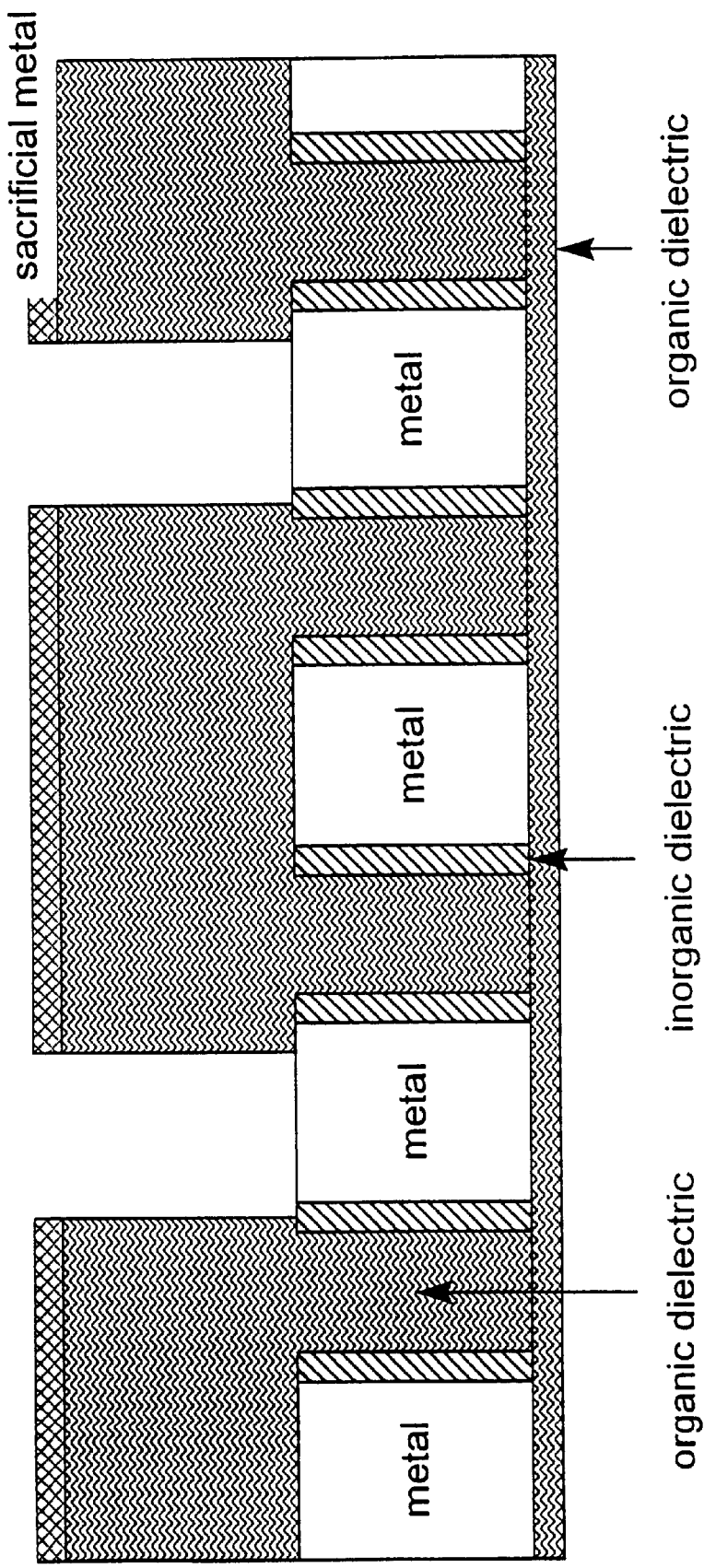
FIG. 3G shows the formation process resulting after anisotropic organic dielectric etch.

In step 8, one performs an anisotropic organic dielectric etch. The etch of the exposed organic dielectric, in oxygen-based plasma chemistry, stops by itself on reaching on the metal and the inorganic dielectric on the side-wall of metal lines due to a very high etch selectivity between organic dielectric and metal and between organic and inorganic dielectrics. At the completion of this step, via holes are fully opened without deep and narrow trenches produced on the side of metal lines. Furthermore, the sacrificial metal has become redundant and is to be removed later. The resist, being organic, is simultaneously removed and the structure of FIG. 3G is obtained.

Figure 3H:
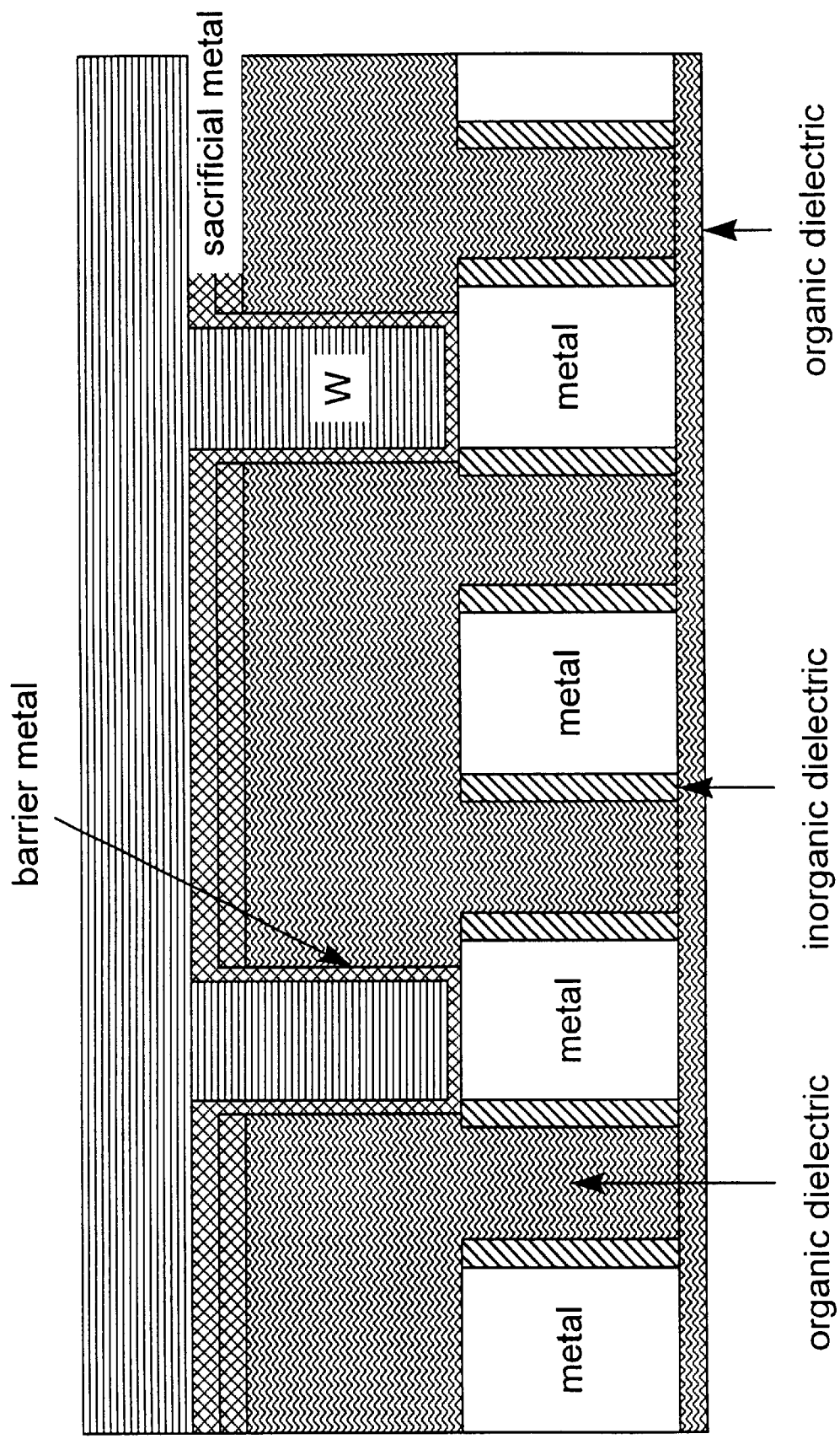
FIG. 3H shows the formation process resulting after barrier metal and tungsten depositions.
Figure 3I:
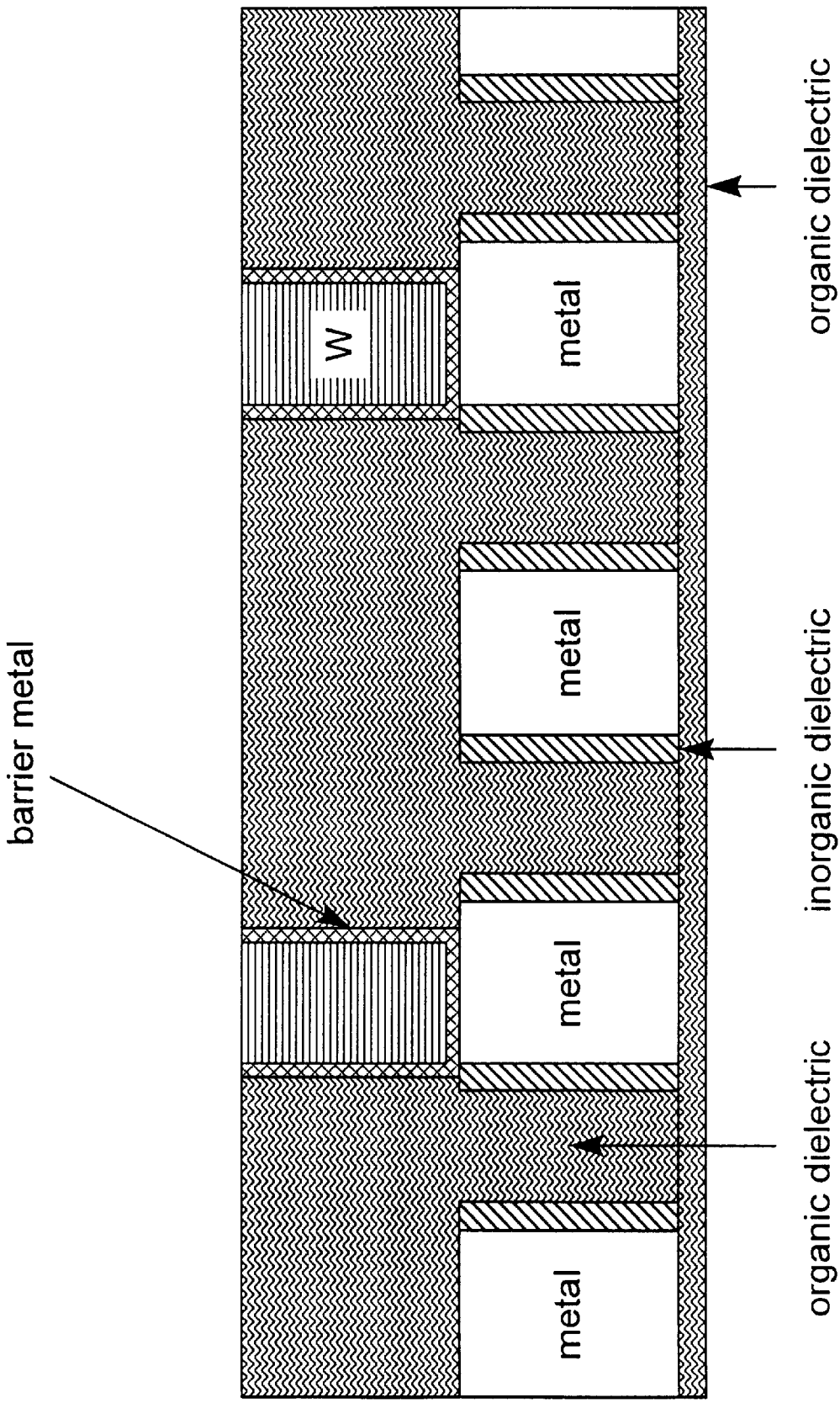
FIG. 3I shows the formation process resulting after chemical mechanical polishing of tungsten, barrier metal and sacrificial metal.

To proceed with another embodiment of the invention, step 9 deposits a layer of a barrier metal on the sacrificial metal layer, and on inside walls and a floor of the vias. The vias are then filled with a fill metal and a layer of the fill metal is deposited on the barrier metal as shown in FIG. 3H. A barrier metal serves to prevent diffusion of the conductive metal into the dielectric layers. The barrier metal may be, for example, Ti or a nitride such TaN or TiN. A barrier metal which is a bilayered film of titanium and TiN can be used. Then the top of the barrier metal layer is covered with a fill metal. At the same time the vias are filled with the fill metal.

The resulting structure can be seen in FIG. 3H. Suitable fill metals include aluminum, aluminum alloys, copper, copper alloys, tantalum, tungsten, titanium or other metals or mixtures thereof as typically employed in the formation of microelectronic devices. The metals may be applied by such techniques as vapor deposition, sputtering, evaporation and the like. Copper is most preferred. As used herein, the term □metal" includes amalgams of metals. In step 10, one removes the top fill metal layer, the barrier metal layer and the sacrificial metal layer to produce the structure of FIG. 3I. Analogously, a floor of the space between the metal contacts on the layer of the third dielectric material could be provided with a layer of Dielectric I if embodiment of FIG. 2B were prepared as described above. It is to be understood that these steps may be repeated to provide a series of suitable layers over one another.

Figure 2C:
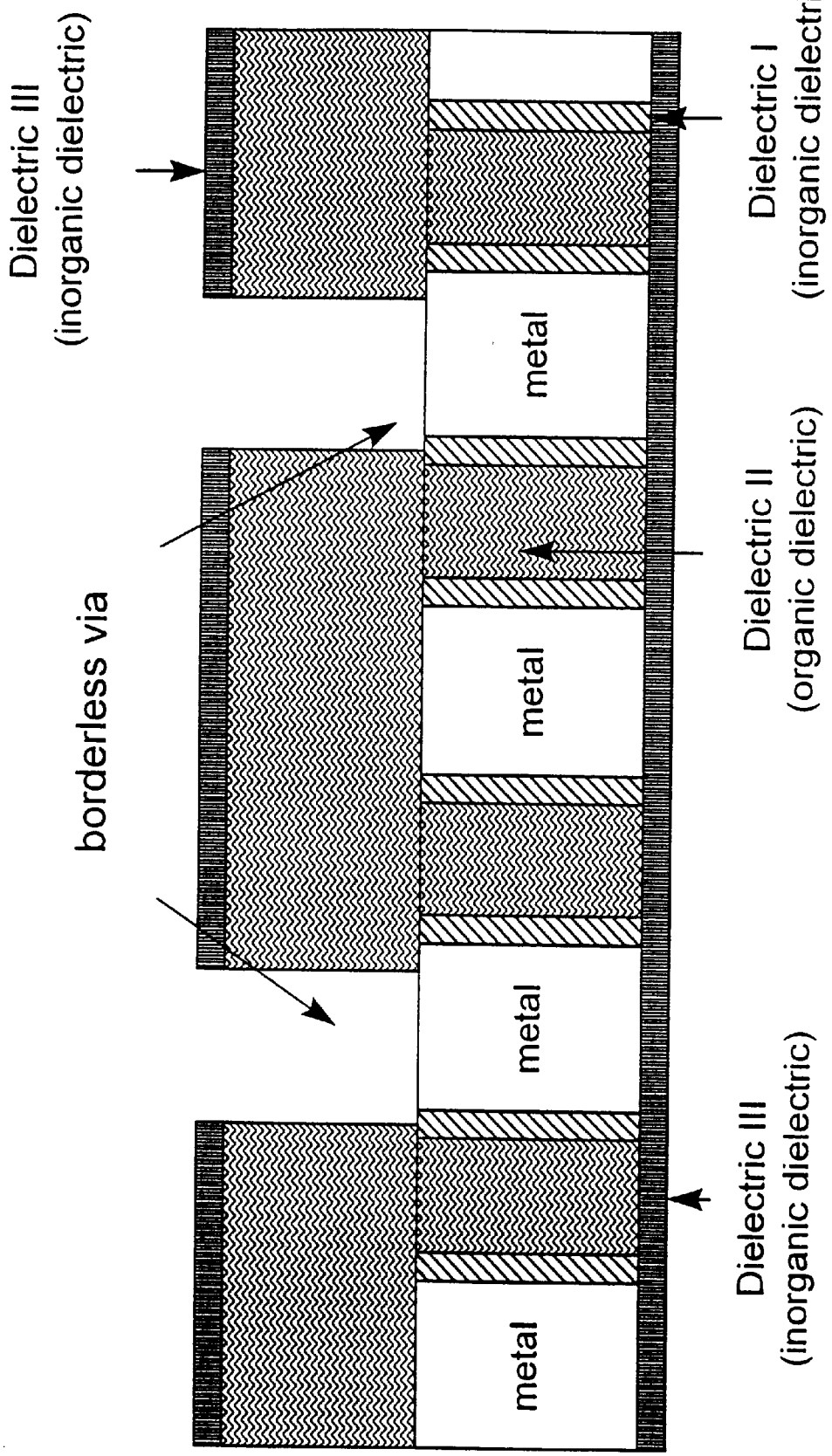
FIG. 2C shows a third embodiment of a new integrated circuit architecture III according to the invention.

A third embodiment of the invention produces architecture III as shown in FIG. 2C. Wherein three dielectrics are used, namely, Dielectric I, Dielectric II and Dielectric III. These may be selected from the dielectric materials enumerated above, however, Dielectrics I and III must be of the same class and must be different from Dielectric II. That is, when Dielectrics I and III are organic, then Dielectric II is inorganic and when Dielectrics I and III are inorganic, then Dielectric II is organic. Although Dielectrics I and III must be of the same class, they need not be identical materials.

Figure 2D:
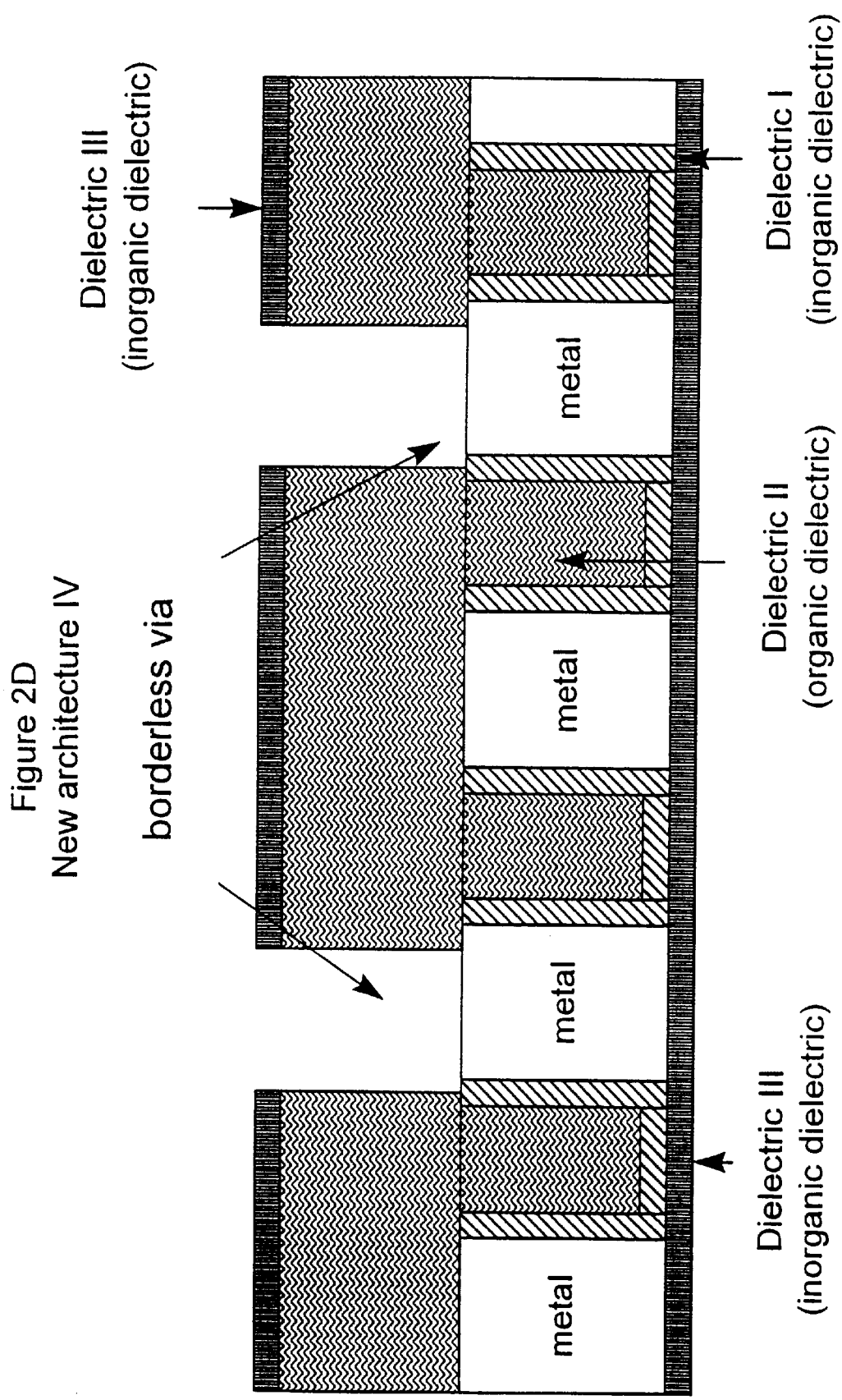
FIG. 2D shows a fourth embodiment of a new integrated circuit architecture IV according to the invention.

Architecture III as shown in FIG. 2C comprises a substrate (not shown) and a layer of a third dielectric material (Dielectric III) positioned on the substrate. A plurality of spaced apart metal contacts are on the layer of the third dielectric material. The metal contacts have side walls and a lining of a first dielectric (Dielectric I) on the side walls. A space between the linings on adjacent metal contact side walls are filled with a second dielectric material (Dielectric II). The top surface of each of the metal contacts, the linings and the spaces are at a common level. An additional layer of the second dielectric material (Dielectric I) is positioned on at least some of the metal contacts, linings and filled spaces. An additional layer of the third dielectric material (Dielectric III) is positioned on the additional layer of the second dielectric material (Dielectric II). At least one via extending through the additional layer of the third dielectric material and the additional layer of the second dielectric material and extends to the top surface of at least one metal contact and optionally at least one of the linings. Although reference is made to at least one via, in actuality, there are many vias and all are open to extend down to their underlying metal contacts. The purpose of each via is to extend to the underlying metal contacts, however, the via may touch the linings on its corresponding contact. The purpose of the lining is to prevent removal of the dielectric material between contacts in the event the via is misaligned with the metal. FIG. 2D shows a fourth embodiment architecture IV where the floor of the space between the linings on the metal contacts is also provided with a layer of Dielectric I.

A process sequence for the production of the structure of FIG. 2C is shown via FIGS. 5A through 5G. These figures show the process flow after the formation of the one interconnect level, however, the same processing steps can be repeated again for upper levels of vias and interconnects. FIG. 5A shows the interim structure at a beginning step which is a deposition of an inorganic low-k third dielectric (Dielectric III) onto a substrate and forming a pattern of metal contacts on the layer of the second dielectric material. Typical materials for the substrates and metal contact lines have been described above. Deposition of the third dielectric onto the substrate may be conducted via conventional spin-coating, dip coating, roller coating, spraying, chemical vapor deposition methods, or meniscus coating methods which are well-known in the art. Spin coating is most preferred. The thickness of the dielectric layers may vary depending on the deposition procedure and parameter setup, but typically the thickness may range from about 500 Å to about 50,000 Å, and preferably from about 2000 Å to about 12000 Å. In the preferred embodiment, a liquid dielectric composition is spun onto the appropriate surface according to known spin techniques such as by applying a liquid dielectric composition to the surface and then spinning on a rotating wheel at speeds ranging from about 500 to about 6000 rpm for about 5 to about 60 seconds. The layer preferably has a density of from about 1 g/cm$^3$ to about 3 g/cm$^3$.

The first process step is to conformally deposit a lining of a first dielectric material (Dielectric I) on side walls of the metal contacts, as well as on a top surface of the metal contacts, and on a floor of a space between the metal contacts on the layer of the third dielectric material as shown in FIG. 5B.

The dielectric lining on the metal contacts may be conformally deposited using chemical vapor deposition techniques. The as-deposited thickness of the dielectric is required to be that its thickness on the sidewall of metal lines is no less than the allowable misalignment between the subsequently printed via and the metal lines underneath it. However, it must be kept thin enough so that no keyholes are formed in it.

The dielectrics may optionally be heated to expel residual solvent or to increase its molecular weight as described above. The dielectric layer may also optionally be exposed to actinic light, such as UV light, to increase its molecular weight or cured by overall exposed to electron beam radiation as described above.

The next step 2 is removing the first dielectric material from the top surface of the metal contacts and the floor of the space between adjacent linings while retaining the first dielectric material lining on the side walls of the metal contacts as shown in FIG. 5C. This is done by anisotropic inorganic dielectric etchback. The inorganic dielectric over metal lines is removed and the etchstop for via etch is formed at this step. This step ensures that the dielectric immediately over metal lines can be different from the one on the side of metal lines. The etchback needs be anisotropic and well-controlled to minimize the recess produced by it. The etchback can be performed in fluorine-based plasma chemistry. In an alternate embodiment of the invention, the dielectric is not removed from the floor of the space between adjacent linings as shown in FIG. 6. This retaining of the dielectric on the floor of the space between adjacent linings is used when it is desired to produce architecture IV as shown in FIG. 2D.

Vias are formed in the organic dielectric layer by well known photolithographic techniques. In step 3 one then deposits an additional layer of the second dielectric material on the top surface of the metal contacts and in the space between adjacent linings of the metal contacts. The deposition of this layer ensures that the dielectric immediately over metal lines is different from the dielectric on the sidewall of metal lines. The presence of this organic dielectric makes it possible for the inorganic dielectric on the sidewall of metal lines the etchstop in the subsequent via etch.

In step 4 one thereafter deposits another layer of a Dielectric III on the additional layer of the second dielectric material. This layer, separates the underlying organic dielectric from the resist spun on in the next step, and serves as hardmask in etching the underlying organic dielectric later. It is required since the resist is also attacked in etching the organic dielectric. This is a key difference between Embodiment I and Embodiment III. This inorganic dielectric layer serves the same function as the sacrificial metal in Embodiment I. However, it is permanent. Significantly high etch selectivity can be easily achieved between inorganic dielectrics and metal thin film and between organic dielectrics and metal thin films. The additional layer of Dielectric III protects the underlying organic dielectric when the resist is removed after the completion of opening via. A layer of a photoresist is then applied and baked on the layer of the additional layer of Dielectric III. The photoresist composition may be positive working or negative working and has been described above. The resulting interim structure is shown in FIG. 5D.

After imagewise removing a portion of the photoresist over at least one metal contact and optionally over at least a portion of the lining of first dielectric material on a side wall of a metal contact, the structure of FIG. 5E is obtained. This figure shows the structure after imagewise patterning and removal of portions of the resist in step 6. Such is formed in a manner well known in the art such as by imagewise exposing and developing the photoresist as described above.

In step 7, after removing the portion of the additional layer of Dielectric III under the removed portion of the photoresist, the structure of FIG. 5F is attained. This is done by anisotropic etch of Dielectric III. The etch stops on reaching the underlying organic dielectric due to a significantly high etch selectivity between Dielectric III and Dielectric II.

In step 8, one performs an anisotropic organic dielectric etch. The etch of the exposed organic dielectric, in oxygen-based plasma chemistry, stops by itself on reaching on the metal and the inorganic dielectric on the side-wall of metal lines due to a very high etch selectivity between the dielectric and metal and between organic and inorganic dielectrics. At the completion of this step, via holes are fully opened without deep and narrow trenches produced on the side of metal lines. Furthermore, the Dielectric III has become redundant and can be removed later if necessary. The resist, being organic, is simultaneously removed and the structure of FIG. 5G is obtained.

To proceed with another embodiment of the invention, step 9 deposits a layer of a barrier metal on additional layer of Dielectric III, and on inside walls and a floor of the vias. The vias are then filled with a fill metal and a layer of the fill metal is deposited on the barrier metal. The structure is similar to that of FIG. 3H except the sacrificial metal layer is the additional layer of Dielectric III. Suitable barrier and fill metal are described above. In step 10, one removes the top fill metal layer, the barrier metal layer additional layer of Dielectric III to produce the structure of FIG. 3I. Analogously, a floor of the space between the metal contacts on the layer of the third dielectric material could be provided with a layer of Dielectric I if embodiment of FIG. 2D were prepared as described above. It is to be understood that these steps may be repeated to provide a series of suitable layers over one another.

Figure 2E:
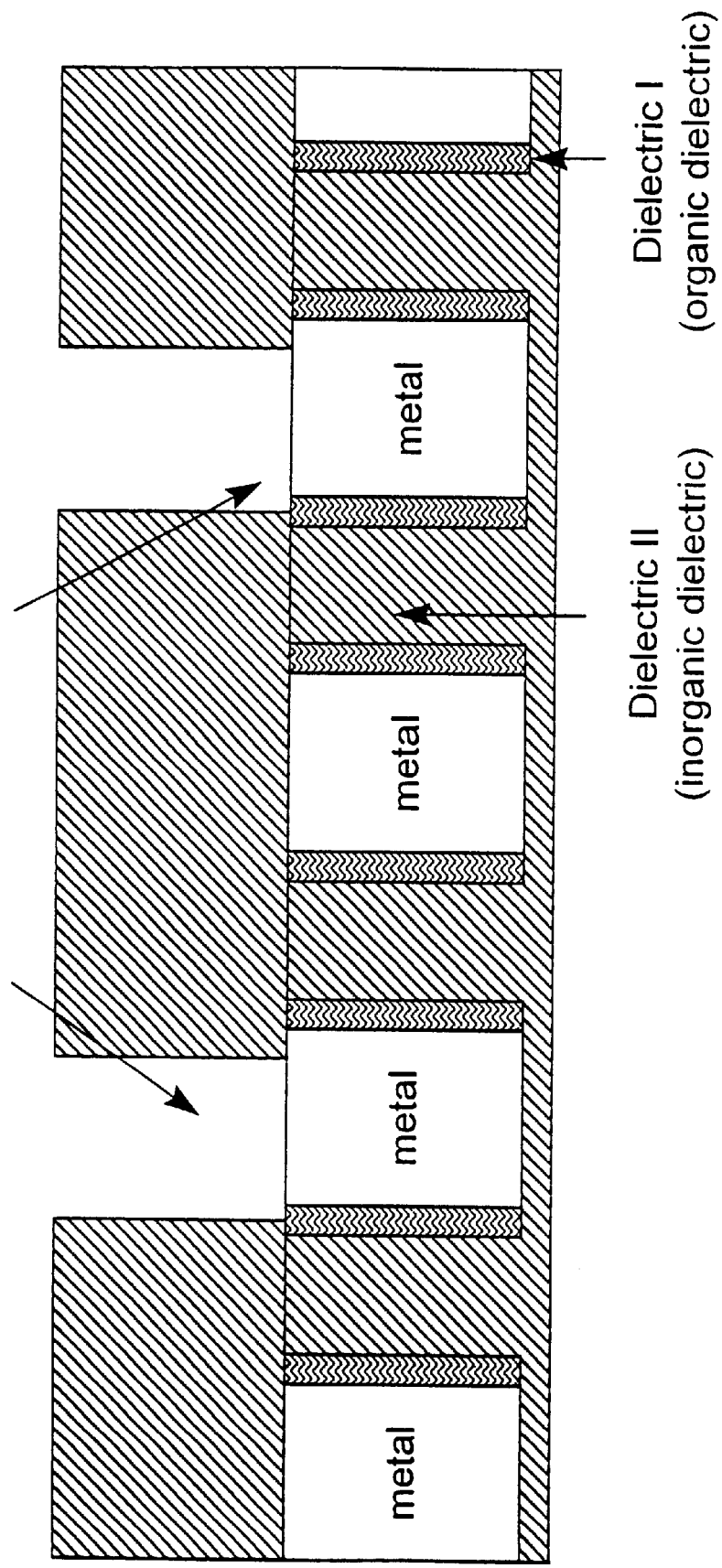
FIG. 2E shows a fifth embodiment of a new integrated circuit architecture V according to the invention.

The fifth integrated circuit architecture V according to the invention is show in FIG. 2E. It differs from Embodiment I in that an inorganic dielectric is used for the bulk of IMD and the lining comprises an organic dielectric instead. The process flow starts at the completion of metal patterning as shown in FIG. 7A.

This structure again uses two different kinds of low-k dielectric thin films for the IMD. One of Dielectric I and Dielectric II is organic and the other is inorganic. That is, if Dielectric I is organic then Dielectric II is inorganic and if Dielectric I is inorganic then Dielectric I is organic. The process steps used for the fabrication of the via and metal levels can be repeated again for the upper levels of vias and metals. The advantage of the invention is a significant difference in plasma etch rate between organic and inorganic dielectrics.

A first process embodiment of the invention for producing the architecture of FIG. 2E is exemplified by FIGS. 7A through 7J. These figures show the process flow after the formation of the one interconnect level, however, the same processing steps can be repeated again for upper levels of vias and interconnects. FIG. 7A shows the interim structure at a beginning step which is a deposition of an inorganic low-k dielectric (Dielectric II) onto a substrate and forming a pattern of metal contacts on the layer of the second dielectric material. Typical substrates are those mentioned above.

The first process step is to conformally deposit a lining of a first organic dielectric material (Dielectric I) on side walls of the metal contacts, as well as on a top surface of the metal contacts, and on a floor of a space between the metal contacts on the layer of the second dielectric material as shown in FIG. 7B. The organic and inorganic dielectric compositions may comprise any of those mentioned above.

Deposition of the Dielectric II onto the substrate may be conducted via conventional spin-coating, dip coating, roller coating, spraying, chemical vapor deposition methods, or meniscus coating methods as mentioned above. The organic dielectric lining Dielectric I on the metal contacts may be conformal deposited using chemical vapor deposition techniques.

The next step 2 is removing the first organic Dielectric I material from the top surface of the metal contacts and the floor of the space between adjacent linings while retaining the first dielectric material lining on the side walls of the metal contacts as shown in FIG. 7C. This is done by anisotropic organic dielectric etchback. In an alternate embodiment of the invention, the dielectric is not removed from the floor of the space between adjacent linings as shown in FIG. 8. This retaining of the dielectric on the floor of the space between adjacent linings is used when it is desired to produce embodiment six architecture VI as shown in FIG. 2F.

Vias are formed in the inorganic dielectric layer by well known photolithographic techniques. In step 3 one then deposits an additional layer of the Dielectric II material on the top surface of the metal contacts and in the space between adjacent linings of the metal contacts. The deposition of this layer ensures that the dielectric immediately over metal lines is different from the dielectric on the sidewall of metal lines. The presence of this inorganic dielectric makes it possible for the organic dielectric on the sidewalls of metal lines the etchstop in the subsequent via etch. In step 4 one thereafter deposits a layer of a sacrificial metal on the additional layer of the second dielectric material. This layer separates the underlying organic dielectric previously deposited from the resist to be spun in the next step. Significantly high etch selectivity can be easily achieved between inorganic dielectrics and metal thin film and between organic dielectrics and metal thin films. The sacrificial metal protects the underlying organic dielectric when resist is removed after the completion of opening via. Suitable etchable metals are described above. A layer of a photoresist is then applied and baked on the layer of the sacrificial metal layer. The photoresist composition may be positive working or negative working and is described above. The resulting interim structure is shown in FIG. 7D.

After imagewise removing a portion of the photoresist over at least one metal contact and optionally over at least a portion of the lining of first dielectric material on a side wall of a metal contact, the structure of FIG. 7E is obtained. This figure shows the structure after imagewise patterning and removal of portions of the resist in step 6. Such is formed in a manner described above. Resist removal is done before the organic dielectric at the bottom of the vias are exposed by via etching. Embodiment I and Embodiment II, having an organic IMD and an inorganic etchstop at via etch, do not have this step. The difference arises from the fact that Embodiment V uses an organic etchstop, which can be exposed only after the resist has been removed first. In step 7, after removing the portion of the layer of the sacrificial metal under the removed portion of the photoresist, the structure of FIG. 7F is attained. This is done by anisotropic sacrificial metal etch as described. In step 8 the balance of the resist is then stripped away to produce the structure of FIG. 7G.

In step 9 one performs an anisotropic inorganic dielectric etch. The etch of the exposed inorganic dielectric stops on reaching the metal and the organic dielectric on the side-wall of metal lines due to a very high etch selectivity between inorganic dielectric and metal and between organic and inorganic dielectrics. At the completion of this step, via holes are fully opened without deep and narrow trenches produced on the side of metal lines and the structure of FIG. 3H is obtained.

To proceed with another embodiment of the invention, step 10 deposits a layer of a barrier metal on the sacrificial metal layer, and on inside walls and a floor of the vias. The vias are then filled with a fill metal and a layer of the fill metal is deposited on the barrier metal as shown in FIG. 7I. Suitable barrier and fill metals are described above. In step 10, one removes the top fill metal layer, the barrier metal layer and the sacrificial metal layer to produce the structure of FIG. 7J. Analogously, a floor of the space between the metal contacts on the layer of the third dielectric material could be provided with a layer of Dielectric I if embodiment of FIG. 2F were prepared as described above. It is to be understood that these steps may be repeated to provide a series of suitable layers over one another.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A process for producing an integrated circuit structure which comprises
    (a) providing a substrate;
    (b) depositing a layer of a second dielectric material on the substrate;
    (c) forming a pattern of metal contacts on the layer of the second dielectric material;
    (d) conformally depositing a lining of a first dielectric material on side walls of the metal contacts, on a top surface of the metal contacts, and on a floor of a space between the metal contacts on the layer of the second dielectric material;
    (e) removing the first dielectric material from the top surface of the metal contacts while retaining the first dielectric material lining on the side walls of the metal contacts;
    (f) depositing an additional layer of the second dielectric material on the top surface of the metal contacts and in the space between adjacent linings of the metal contacts;

(g) depositing a layer of a sacrificial metal on the additional layer of the second dielectric material;

(h) depositing a layer of a photoresist on the layer of the sacrificial metal layer;

(i) imagewise removing a portion of the photoresist over at least one metal contact and optionally over at least a portion of the lining of first dielectric material on a side wall of a metal contact;

(j) removing the portion of the layer of the sacrificial metal under the removed portion of the photoresist;

(k) removing the balance of the photoresist layer, and removing the portion of the additional layer of the second dielectric material under the removed portion of the sacrificial metal layer until at least one metal contact and optionally a lining on a side wall of a metal contact is reached thus forming at least one via through the second dielectric material extending to at least one metal contact and optionally a lining of a side wall of a metal contact.

2. The process of claim 1 further comprising:

(l) depositing a layer of a barrier metal on the sacrificial metal layer, and on inside walls and a floor of the at least one via;

(m) filling the at least one via with a fill metal and depositing a layer of a fill metal on the layer of the barrier metal;

(n) removing the fill metal layer, the barrier metal layer and the sacrificial metal layer.

3. The process of claim 1 wherein step (e) further comprises removing the first dielectric material from the floor of the space between the metal contacts.

4. The process of claim 2 wherein step (e) further comprises removing the first dielectric material from the floor of the space between the metal contacts.

5. The process of claim 1 wherein the first dielectric material is organic and the second dielectric material is inorganic.

6. The process of claim 1 wherein the first dielectric material is inorganic and the second dielectric material is organic.

7. The process of claim 2 wherein the first dielectric material is organic and the second dielectric material is inorganic.

8. The process of claim 2 wherein the first dielectric material is inorganic and the second dielectric material is organic.

9. The process of claim 3 wherein the first dielectric material is organic and the second dielectric material is inorganic.

10. The process of claim 3 wherein the first dielectric material is inorganic and the second dielectric material is organic.

11. The process of claim 4 wherein the first dielectric material is organic and the second dielectric material is inorganic.

12. The process of claim 4 wherein the first dielectric material is inorganic and the second dielectric material is organic.

13. A process for producing an integrated circuit structure which comprises (a) providing a substrate;

(b) depositing a layer of a third dielectric material on the substrate;

(c) forming a pattern of metal contacts on the layer of the third dielectric material;

(d) conformally depositing a lining of a first dielectric material on side walls of the metal contacts, on a top surface of the metal contacts, and on a floor of a space between the metal contacts on the layer of the third dielectric material;

(e) removing the first dielectric material from the top surface of the metal contacts while retaining the first dielectric material lining on the side walls of the metal contacts;

(f) depositing a layer of a second dielectric material on the top surface of the metal contacts and in the space between adjacent linings of the metal contacts;

(g) depositing an additional layer of the third dielectric material on the layer of the second dielectric material;

(h) depositing a layer of a photoresist on the additional layer of the third dielectric material;

(i) imagewise removing a portion of the photoresist over at least one metal contact and optionally over at least a portion of the lining of first dielectric material on a side wall of a metal contact;

(j) removing the portion of the additional layer of the third dielectric material under the removed portion of the photoresist;

(k) removing the balance of the photoresist layer, and removing the portion of the second dielectric material under the removed portion of the additional layer of the third dielectric material until at least one metal contact and optionally a lining on a side wall of a metal contact is reached thus forming at least one via through the second dielectric material extending to at least one metal contact and optionally a lining of a side wall of a metal contact.

14. The process of claim 13 further comprising:

(l) depositing a layer of a barrier metal on the additional layer of the third dielectric, and on the inside walls and a floor of the at least one via;

(m) filling the at least one via with a fill metal and depositing a layer of a fill metal on the layer of the barrier metal;

(n) removing the fill metal layer, the barrier metal layer and the sacrificial metal layer.

15. The process of claim 13 wherein step (e) further comprises removing the first dielectric material from the floor of the space between the metal contacts.

16. The process of claim 14 wherein step (e) further comprises removing the first dielectric material from the floor of the space between the metal contacts.

17. The process of claim 13 wherein the first and third dielectric materials are organic and the second dielectric material is inorganic.

18. The process of claim 13 wherein the first and third dielectric materials are inorganic and the second dielectric material is organic.

19. The process of claim 14 wherein the first and third dielectric materials are organic and the second dielectric material is inorganic.

20. The process of claim 14 wherein the first and third dielectric materials are inorganic and the second dielectric material is organic.

21. The process of claim 15 wherein the first and third dielectric materials are organic and the second dielectric material is inorganic.

22. The process of claim 15 wherein the first and third dielectric materials are inorganic and the second dielectric material is organic.

23. The process of claim 16 wherein the first and third dielectric materials are organic and the second dielectric material is inorganic.

24. The process of claim 16 wherein the first and third dielectric materials are inorganic and the second dielectric material is organic.

* * * * *